(12) United States Patent
Aoki et al.

(10) Patent No.: US 11,750,086 B2
(45) Date of Patent: Sep. 5, 2023

(54) DRIVE CIRCUIT FOR POWER CONVERTER

(71) Applicant: DENSO CORPORATION, Kariya (JP)

(72) Inventors: Yasuaki Aoki, Kariya (JP); Tomohiro Nezuka, Kariya (JP); Akimasa Niwa, Kariya (JP)

(73) Assignee: DENSO CORPORATION, Kariya (JP)

( * ) Notice: Subject to any disclaimer, the term of this patent is extended or adjusted under 35 U.S.C. 154(b) by 73 days.

(21) Appl. No.: 17/547,840

(22) Filed: Dec. 10, 2021

(65) Prior Publication Data

US 2022/0103061 A1 Mar. 31, 2022

Related U.S. Application Data

(63) Continuation of application No. PCT/JP2020/022753, filed on Jun. 9, 2020.

(30) Foreign Application Priority Data

Jun. 11, 2019 (JP) ................................. 2019-109011

(51) Int. Cl.
| | |
|---|---|
| H02M 1/08 | (2006.01) |
| H02M 1/38 | (2007.01) |
| H02M 7/5387 | (2007.01) |
| H03K 17/16 | (2006.01) |
| H02M 1/00 | (2006.01) |
| H02P 27/06 | (2006.01) |

(52) U.S. Cl.
CPC ............ *H02M 1/385* (2021.05); *H02M 1/08* (2013.01); *H02M 7/53871* (2013.01); *H03K 17/165* (2013.01); *H02M 1/0054* (2021.05); *H02P 27/06* (2013.01); *H03K 2217/0063* (2013.01); *H03K 2217/0072* (2013.01)

(58) Field of Classification Search
CPC ........................................................ H02M 1/08
USPC ........................................................ 327/109
See application file for complete search history.

(56) References Cited

U.S. PATENT DOCUMENTS

2023/0114152 A1* 4/2023 Akiyama ............... H03K 17/16
327/427

FOREIGN PATENT DOCUMENTS

| JP | 2000-092824 A | 3/2000 |
|---|---|---|
| JP | 2008-061413 A | 3/2008 |
| JP | 5326913 B2 | 10/2013 |

* cited by examiner

*Primary Examiner* — Tomi Skibinski
(74) *Attorney, Agent, or Firm* — Oliff PLC

(57) ABSTRACT

In a drive circuit, a differential circuit unit is configured such that resetting of an output voltage of the differential circuit unit is carried out, and the resetting of the output voltage of the differential circuit unit is cancelled. A value of the difference between first and second divided terminal voltages at a timing of cancelling the resetting is defined as a reference voltage. The differential circuit unit generates, as the output voltage, a product of a voltage change from a reference voltage and a predetermined amplification factor after cancelling of the resetting of the differential circuit unit. A signal generator generates a gate signal for the upper- and lower-arm switches in accordance with a value of the output voltage of the differential circuit unit while the upper- and lower-arm switches are in an off state.

13 Claims, 18 Drawing Sheets

GS

GH

GL

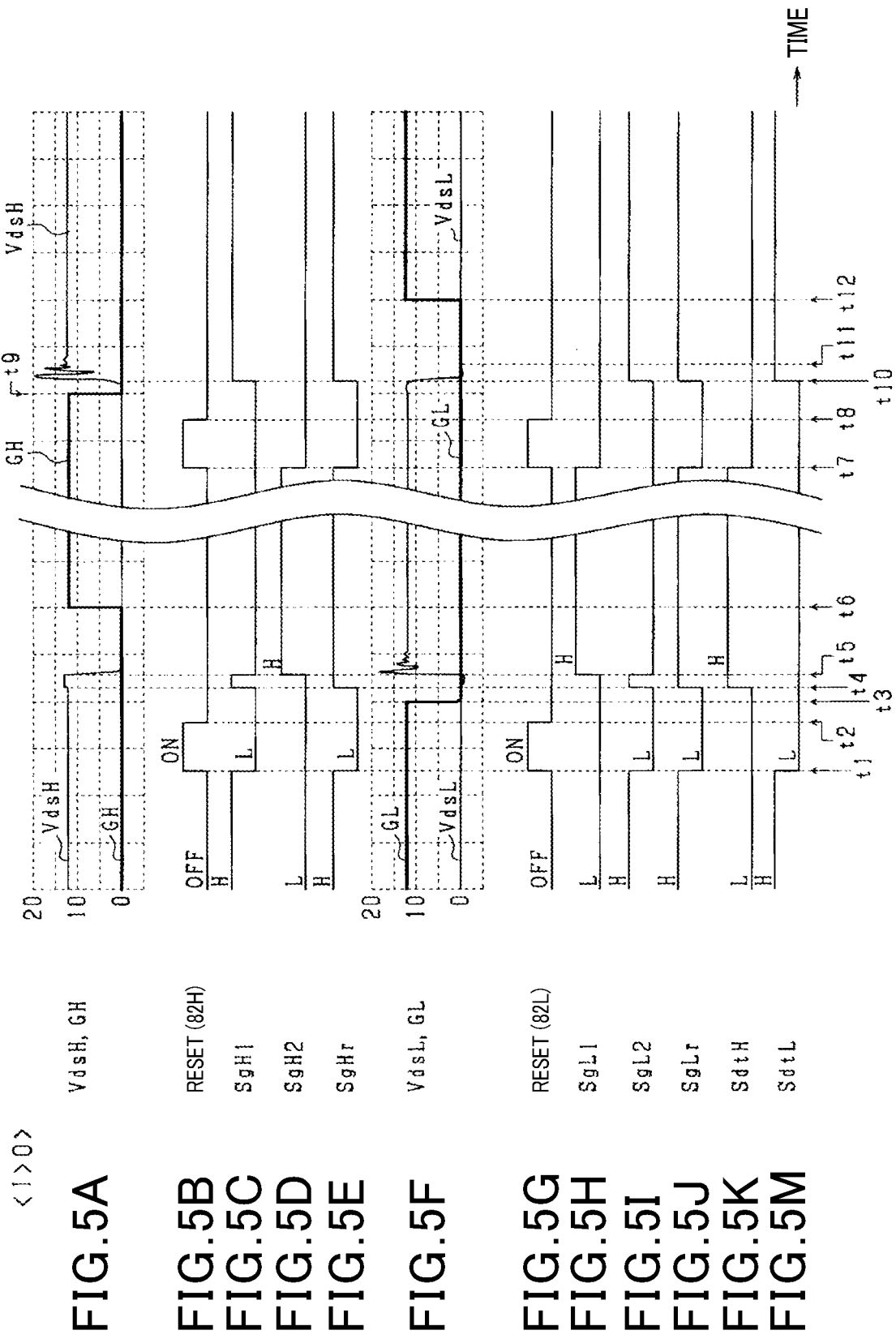

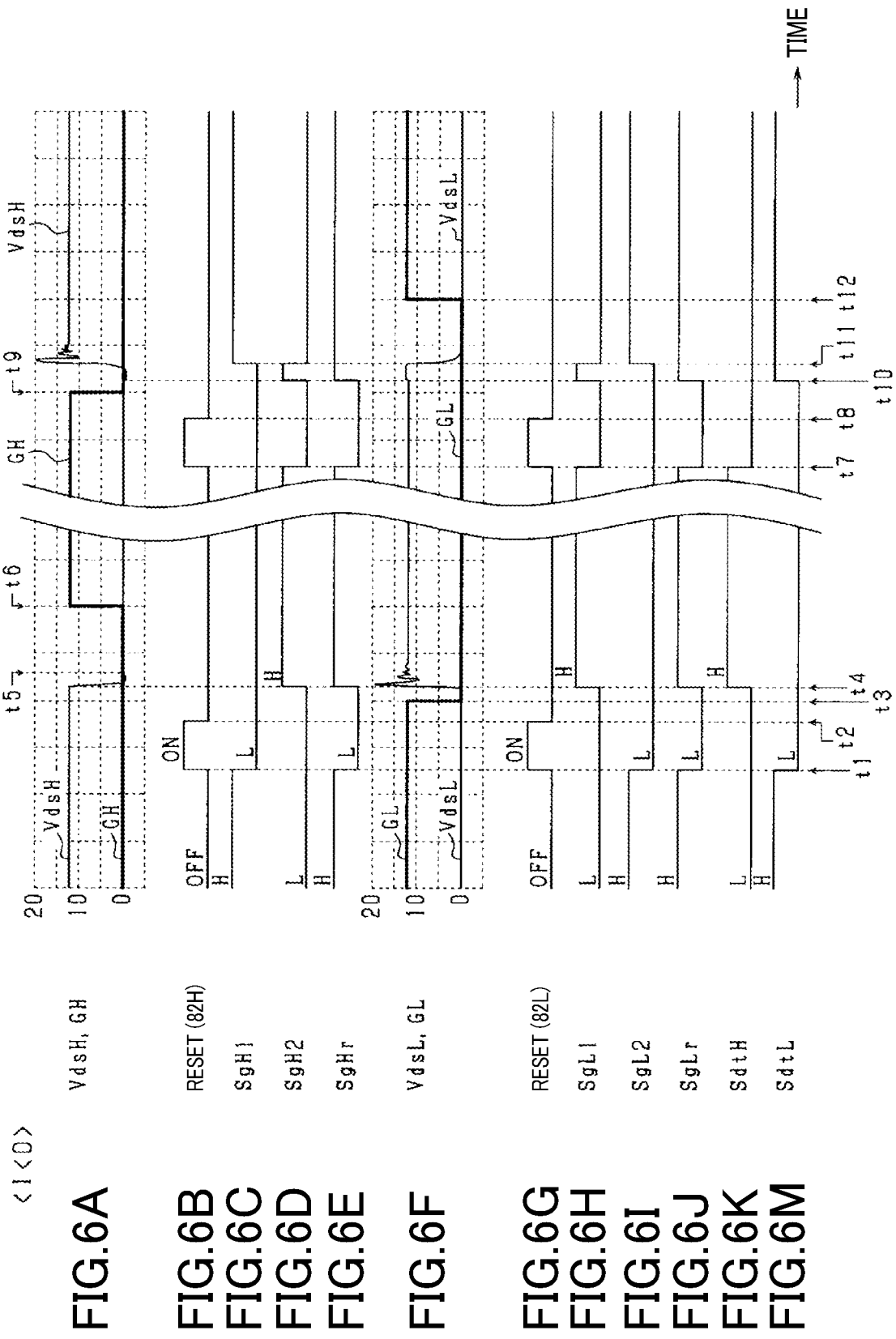

(a) IS EXECUTION OF RESETTING ENABLED WITHIN FIRST PERIOD REPRESENTING Vds = VDC (12 V), AND, WHEN EXECUTION OF RESETTING IS NOT ENABLED, CHANGE VT1, WHICH IS EQUAL TO V$\alpha$ (0.4 V), TO FOLLOWING EQUATION (1), AND CHANGE VT2, WHICH IS EQUAL TO -V$\alpha$ (-0.4V) TO FOLLOWING EQUATION (2):
VT1 = V$\alpha$ + VDC (12.4 V)   (1)
VT2 = -V$\alpha$ + VDC (11.6 V)   (2)

(b) IS EXECUTION OF RESETTING ENABLED WITHIN SECOND PERIOD REPRESENTING Vds = 0 V, AND, WHEN EXECUTION OF RESETTING IS NOT ENABLED, CHANGE VT1, WHICH IS EQUAL TO V$\alpha$ (0.4 V), TO FOLLOWING EQUATION (3), AND CHANGE VT2, WHICH IS EQUAL TO -V$\alpha$ (-0.4V) TO FOLLOWING EQUATION (4):
VT1 = V$\alpha$ - VDC (-11.6 V)   (3)
VT2 = -V$\alpha$ - VDC (-12.4 V)   (4)

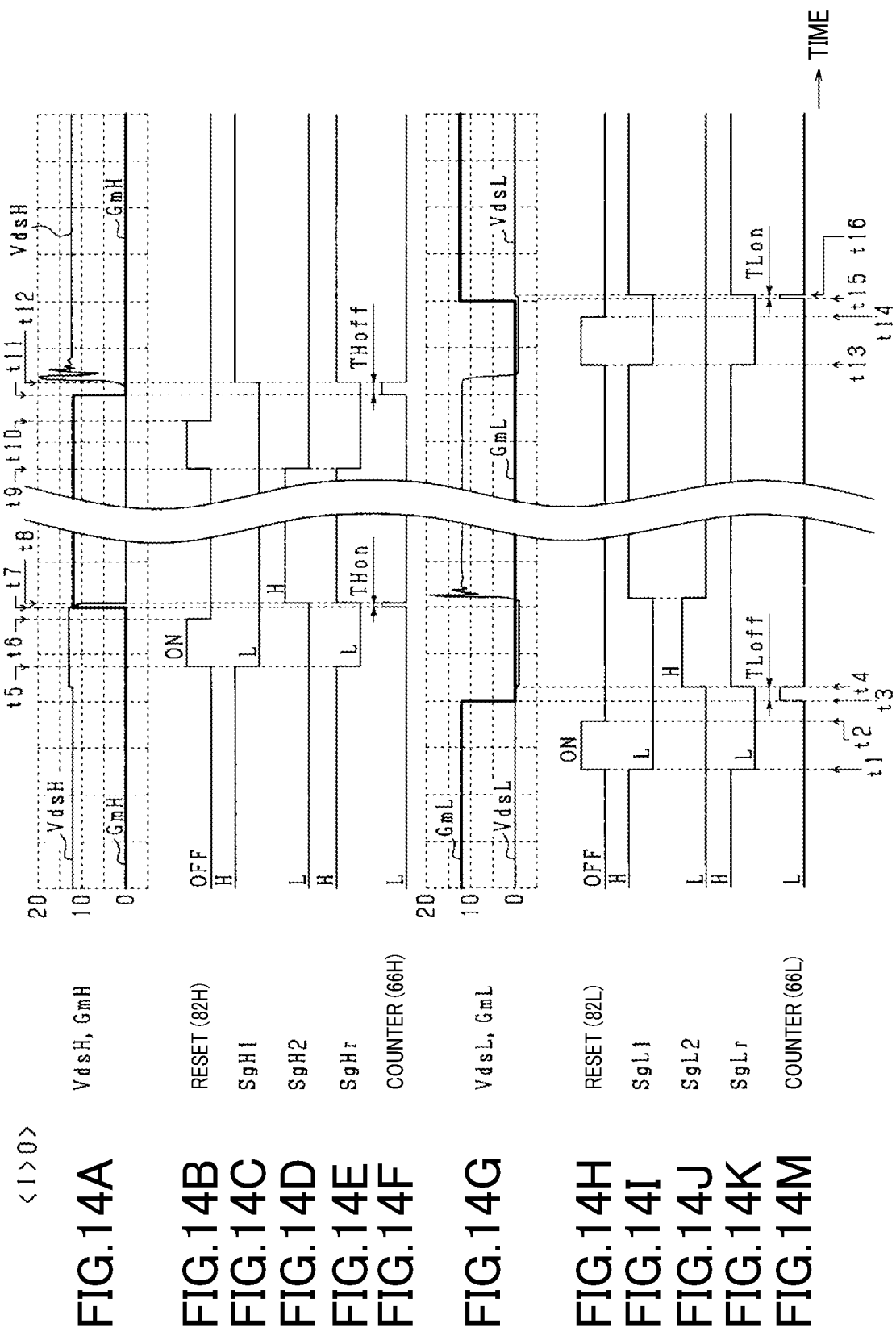

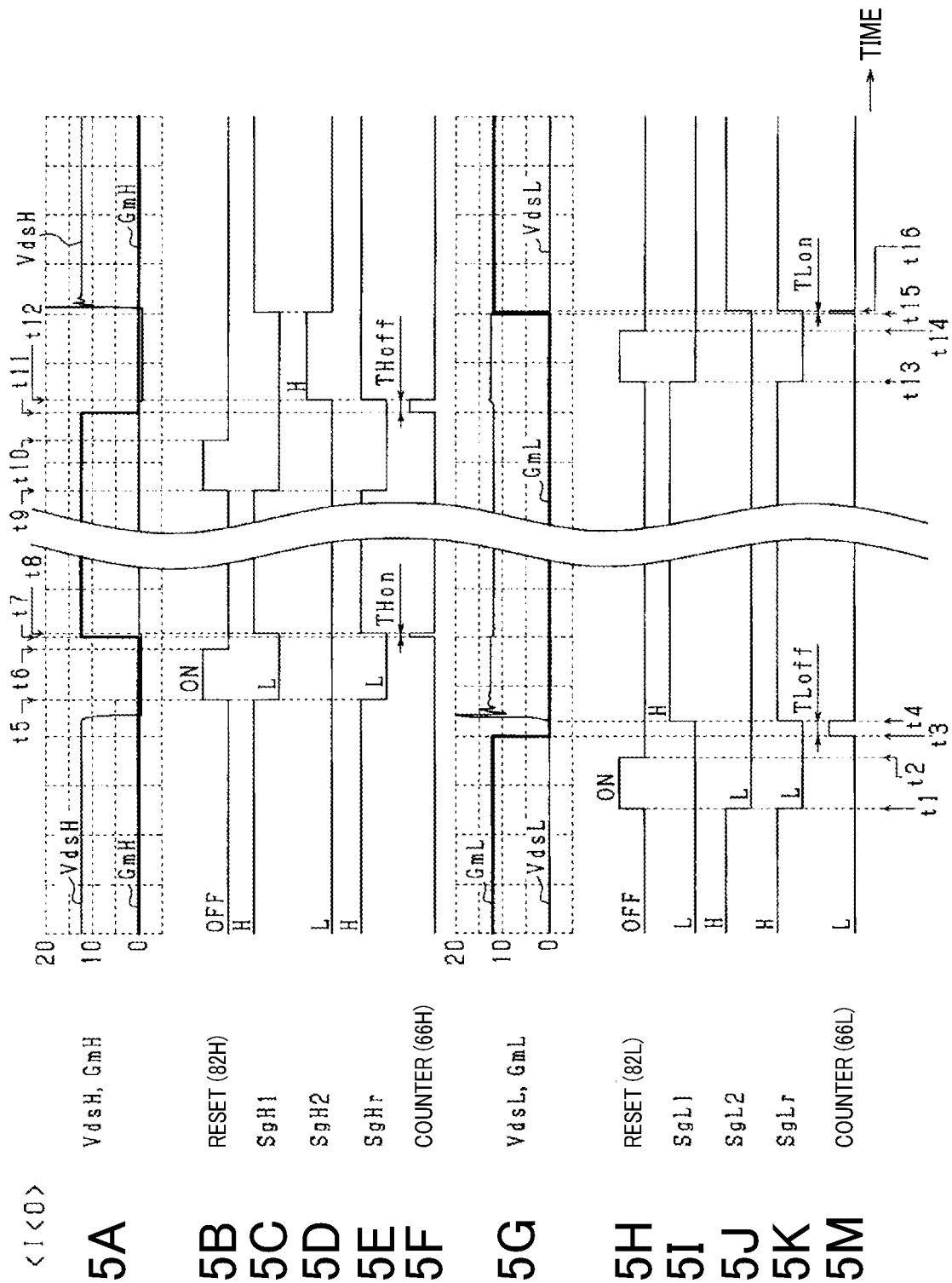

FIG.20A
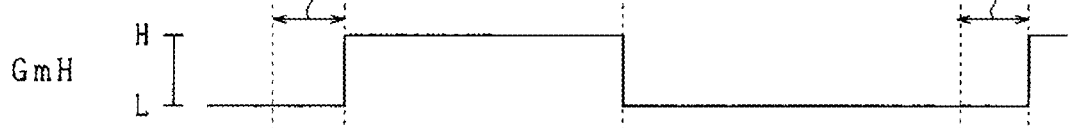
FIG.20B
FIG.20C
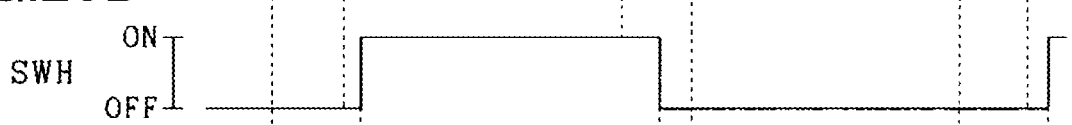
FIG.20D
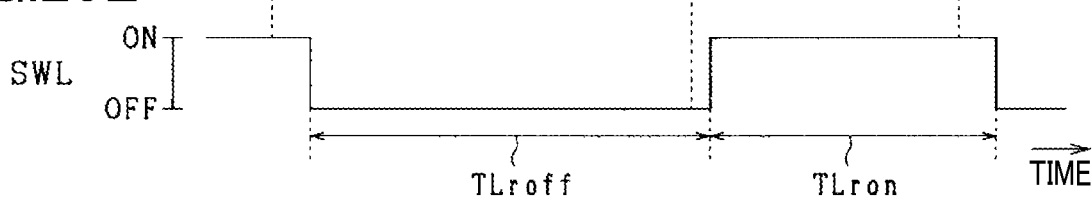
FIG.20E
FIG.21
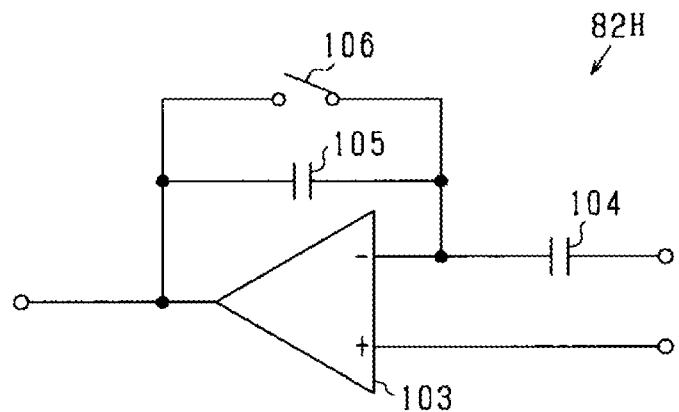

DRIVE CIRCUIT FOR POWER CONVERTER

CROSS REFERENCE TO RELATED APPLICATION

The present application is a bypass continuation application of currently pending international application No. PCT/JP2020/022753 filed on Jun. 9, 2020 designating the United States of America, the entire disclosure of which is incorporated herein by reference, the internal application being based on and claiming the benefit of priority from Japanese Patent Application No. 2019-109011 filed on Jun. 11, 2019.

TECHNICAL FIELD

The present disclosure relates to drive circuits for power converters; each of the power converters includes an upper-arm switch and a lower-arm switch, and diodes connected in antiparallel to the respective upper- and lower-arm switches.

BACKGROUND

One of such conventional drive circuits is designed to calculate a deadtime during which both series-connected upper- and lower-arm switches are in an off state.

SUMMARY

An exemplary aspect of the present disclosure provides a drive circuit that includes a differential circuit unit. The differential circuit unit is configured such that resetting of an output voltage of the differential circuit unit is carried out, and the resetting of the output voltage of the differential circuit unit is cancelled. A value of the difference between first and second divided terminal voltages at a timing of cancelling the resetting is defined as a reference voltage. The differential circuit unit generates, as the output voltage, a product of a voltage change from a reference voltage and a predetermined amplification factor after cancelling of the resetting of the differential circuit unit. The drive circuit includes a signal generator that generates a gate signal for the upper- and lower-arm switches in accordance with a value of the output voltage of the differential circuit unit while the upper- and lower-arm switches are in an off state.

BRIEF DESCRIPTION OF THE DRAWINGS

Other aspects of the present disclosure will become apparent from the following description of embodiments with reference to the accompanying drawings in which:

FIGS. 5A to 5K and 5M are a joint timing chart schematically illustrating how the drive IC operates during a positive phase current flowing;

FIGS. 6A to 6K and 6M are a joint timing chart schematically illustrating how the drive IC operates during a negative phase current flowing;

FIG. 10 is a diagram schematically illustrating a threshold change task carried out by the drive IC;

FIGS. 14A to 14K and 14M are a joint timing chart schematically illustrating how to measure turn-on and turn-off times during the positive phase current flowing;

FIGS. 15A to 15K and 15M are a joint timing chart schematically illustrating how to measure the turn-on and turn-off times during the negative phase current flowing;

FIGS. 20A to 20E are a joint timing chart schematically illustrating a second pattern of how the gate signals and switches are each changed over time; and FIG. 21 is a circuit diagram of an upper-arm detector according to an additional modification of the first embodiment.

DETAILED DESCRIPTION OF EMBODIMENTS

Figure 1:
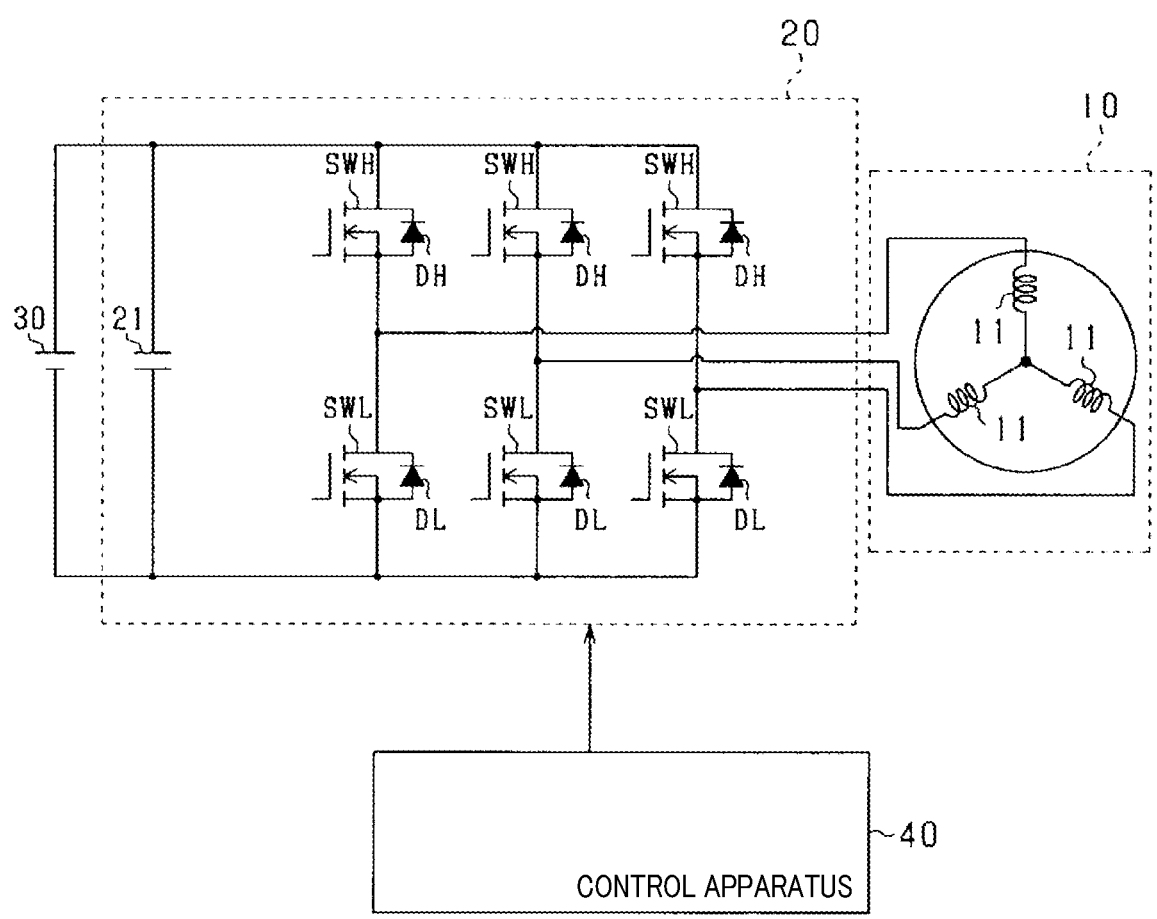
FIG. 1 is an overall structural diagram of a control system according to the first embodiment of the present disclosure.

Such a conventional drive circuit, which has a function of measuring a deadtime, is disclosed in Japanese Patent Publication No. 5326913. The drive circuit disclosed in the patent publication calculates the deadtime in accordance with a voltage drop across one of the diodes connected in antiparallel to respective upper- and lower-arm switches. The drive circuit disclosed in the patent publication performs a known deadtime compensation task based on the measured deadtime.

The drive circuit disclosed in the patent publication requires, using a voltage sensor, i.e., a voltage detector, measurement of a voltage across controlled terminals, i.e., input terminals, of at least one of the series-connected upper- and lower-arm switches for calculation of the deadtime. The voltage across the controlled terminals of at least one of the series-connected upper- and lower-arm switches that are connected in parallel to a direct-current (DC) power source may vary, based on a driven state of the at least one of the series-connected upper- and lower-arm switches, within the range between 0 V or thereabout and an upper limit voltage close to an output voltage of the DC power source.

For this reason, the voltage sensor needs to have a larger withstand voltage range. This unfortunately may result in a longer insulation distance defined in the voltage sensor. This may therefore lead to a larger size of the voltage sensor, resulting in a larger size of the drive circuit.

From this viewpoint, the present disclosure seeks to provide drive circuits for a power converter, each of which has a smaller size.

A first exemplary measure of the present disclosure provides a drive circuit for a power converter (20) that includes an upper-arm switch (SWH) and a lower-arm switch (SWL), each of which has first and second terminals. Diodes (DH, DL) are connected in antiparallel to the respective upper- and lower-arm switches. The drive circuit includes a signal generator (60, 87H, 88H, 87L, 88L) configured to generate a gate signal that alternately turns on the upper- and lower-arm switches while preventing the upper- and lower-arm switches being simultaneously in an on state.

The drive circuit includes a voltage divider (84a, 84b, 85a, 85b, 104, 105) configured to divide a first voltage at the first terminal of at least one target switch that is at least one of the upper- and lower-arm switches, and a second voltage at the second terminal of the at least one target switch to thereby obtain a first divided terminal voltage and a second divided terminal voltage.

The drive circuit includes a differential circuit unit (83, 86a, 86b) having a first input terminal and a second input terminal. The first divided terminal voltage is inputted to the first input terminal of the differential circuit unit, and the second divided terminal voltage is inputted to the second input terminal of the differential circuit unit. The differential circuit unit is configured to generate an output voltage based on a difference between the first and second divided terminal voltages. The differential circuit unit is configured such that (i) resetting of the output voltage of the differential circuit unit is carried out, and (ii) the resetting of the output voltage of the differential circuit unit is cancelled. A value of the difference between the first and second divided terminal voltages at a timing of cancelling the resetting is defined as a reference voltage.

The differential circuit unit is configured to generate, as the output voltage, a product of a voltage change from the reference voltage and a predetermined amplification factor after cancelling of the resetting of the differential circuit unit. The signal generator is configured to generate the gate signal for each of the upper- and lower-arm switches in accordance with a value of the output voltage of the differential circuit unit while the upper- and lower-arm switches are in an off state.

The first exemplary measure of the present disclosure includes the voltage divider and the differential circuit unit. The voltage divider enables each of the first and second divided terminal voltages inputted to a corresponding one of the first and second input terminals of the differential circuit unit to be reduced. The differential circuit unit makes it possible to generate the output voltage based on the difference between the first and second divided terminal voltages.

This enables the differential circuit unit to have a smaller withstand voltage range, making it possible for the differential circuit unit to have a smaller size.

Additionally, the differential circuit unit is configured to generate, as the output voltage, the product of the voltage change from the reference voltage and the predetermined amplification factor after cancelling of the resetting of the differential circuit unit. This enables a change of the voltage between the first and second terminals to be detected as the voltage change from the reference voltage. This therefore makes it possible to reduce an input voltage to the differential circuit unit, thus contributing to the smaller size of the differential circuit unit.

The smaller size of the differential circuit unit results in a smaller size of drive circuit.

In a second exemplary measure of the present disclosure, which depends from the first exemplary measure, the at least one target switch has a high-side terminal as the first terminal, and a low-side terminal as the second terminal.

The voltage divider includes a first input capacitor (84a) arranged to connect the high-side terminal of the at least one target switch and the first input terminal of the differential circuit unit, a second input capacitor (84b) arranged to connect the low-side terminal of the at least one target switch and the second input terminal of the differential circuit unit, a first hold capacitor (85a) having a first end and a second end, the first end of the first hold capacitor being connected to the first input terminal of the differential circuit unit, and a second hold capacitor (85b) having a first end and a second end, the first end of the second hold capacitor being connected to the second input terminal of the differential circuit unit.

The differential circuit unit includes a fully differential amplifier (83) having a first output terminal and a second output terminal, the first output terminal being connected to the second end of the first hold capacitor, the second output terminal being connected to the second end of the second hold capacitor. The differential circuit unit includes a first reset switch (86a) connected in parallel to the first hold capacitor, and a second reset switch (86b) connected in parallel to the second hold capacitor.

Each of the first and second reset switches is switched from an off state to an on state, so that the resetting of the voltage outputted from the differential circuit unit is carried out. Each of the first and second reset switches is switched from the on state to the off state, so that the resetting of the output voltage of the differential circuit unit is cancelled.

In a third exemplary measure of the present disclosure, which depends from the first exemplary measure, the at least one target switch has a high-side terminal as the first terminal, and a low-side terminal as the second terminal. The voltage divider includes an input capacitor (104) arranged to connect the high-side terminal of the at least one target switch and the first input terminal of the differential circuit unit. The voltage divider includes a hold capacitor (105) having a first end and a second end, the first end of the hold capacitor being connected to the first input terminal of the differential circuit unit. The differential circuit unit includes a differential amplifier (103) having an output terminal connected to the second end of the hold capacitor, and a reset switch (106) connected in parallel to the hold capacitor. The reset switch is switched from an off state to an on state, so that the resetting of the output voltage of the differential circuit unit is carried out. The reset switch is switched from the on state to the off state, so that the resetting of the output voltage of the differential circuit unit is cancelled.

In a fourth exemplary measure of the present disclosure, which depends from the first exemplary measure, the resetting of the output voltage of the differential circuit unit is carried out while only one of the upper-arm switch and the lower-arm switch is in the on state. The resetting of the output voltage of the differential circuit unit is cancelled until the only one of the upper-arm switch and the lower-arm switch is switched from the on state to the off state.

In a fifth exemplary measure of the present disclosure, which depends from the first exemplary measure, the signal generator is configured to 1. Compare the output voltage of the differential circuit unit with a predetermined threshold (V$\alpha$, −V$\alpha$, VT1, VT2) while both the upper- and lower-arm switches are in the off state to thereby determine whether one of the upper- and lower-arm switches is switched from the off state to the on state 2. Generate a high/low level signal based on determination of whether one of the upper- and lower-arm switches is switched from the on state to the off state 3. Generate the gate signal for each of the upper- and lower-arm switches based on the high/low level signal In a sixth exemplary measure of the present disclosure, which depends from the fifth exemplary measure, execution of the resetting of the output voltage of the differential circuit unit and cancellation of the resetting are cyclically repeated. The signal generator is configured to determine whether a time that has elapsed since the resetting of the output voltage of the differential circuit unit executed at a current cycle until cancellation of the resetting executed at the current cycle is smaller than a predetermined threshold time. The signal generator is configured to change a value of the predetermined threshold to another value without execution of the resetting of the output voltage of the differential circuit unit at a next cycle upon determination that the time that has elapsed since the resetting of the output voltage of the differential circuit unit executed at the current cycle until cancellation of the resetting executed at the current cycle is smaller than the predetermined threshold time.

In a seventh exemplary measure of the present disclosure, which depends from the fifth exemplary measure, a voltage drop across the diode of the at least one target switch is changeable within a predetermined range from a lower limit to an upper limit inclusive. An absolute value of the predetermined threshold is set to a value smaller than the lower limit of the range.

In an eighth exemplary measure of the present disclosure, which depends from the fifth exemplary measure, the gate signal for each of the upper- and lower-arm switches has one of an on command for turning on the corresponding one of the upper- and lower-arm switches, and an off command for turning off the corresponding one of the upper- and lower-arm switches. One of the upper-arm switch and the lower-arm switch, which is currently in the on state, is defined as a currently on-state switch, and the other of the upper-arm switch and the lower-arm switch, which is scheduled to be turned on next, is defined as an opposing turn-on switch. The signal generator is configured to change the gate signal for the opposite turn-on switch from the off command to the on command upon determination that the high/low level signal represents that the currently on-state switch is switched from the on state to the off state.

In a ninth exemplary measure of the present disclosure, which depends from the fifth exemplary measure, the gate signal for each of the upper- and lower-arm switches has one of an on command for turning on the corresponding one of the upper- and lower-arm switches, and an off command for turning off the corresponding one of the upper- and lower-arm switches. The signal generator is configured to generate the gate signal alternately changing between the on command and the off command for alternately turning on the upper- and lower-arm switches while setting a deadtime that prevents the upper- and lower-arm switches being simultaneously in the on state.

The drive circuit further includes a measuring unit configured to measure, based on the high/low level signal, a turn-on time and a turn-off time of at least one of the upper-arm switch and the lower-arm switch. The turn-on time of the at least one of the upper-arm switch and the lower-arm switch represents a time that has elapsed since the on command of the gate signal was generated until the at least one of the upper-arm switch and the lower-arm switch is actually turned on. The turn-off time of the at least one of the upper-arm switch and the lower-arm switch represents a time that has elapsed since the off command of the gate signal was generated until the at least one of the upper-arm switch and the lower-arm switch is actually turned off. The drive circuit further includes a corrector configured to correct, based on the turn-on time and the turn-off time measured by the measuring unit, the gate signal to thereby bring an actual operating state of each of the upper- and lower-arm switches to approach a corresponding operating state defined by the gate signal.

In a tenth exemplary measure of the present disclosure, which depends from the ninth exemplary measure, the corrector is configured to correct the gate signal to thereby correct the deadtime.

In an eleventh exemplary measure of the present disclosure, which depends from the fifth exemplary measure, the gate signal for each of the upper- and lower-arm switches has one of an on command for turning on the corresponding one of the upper- and lower-arm switches, and an off command for turning off the corresponding one of the upper- and lower-arm switches. The signal generator is configured to generate the gate signal alternately changing between the on command and the off command for alternately turning on the upper- and lower-arm switches while setting a deadtime that prevents the upper- and lower-arm switches being simultaneously in the on state.

The drive circuit includes an on-period measuring unit configured to measure, based on the high/low level signal, an on period of at least one of the upper-arm switch and the lower-arm switch. The on period of the at least one of the upper-arm switch and the lower-arm switch represents a period during which the at least one of the upper-arm switch and the lower-arm switch is held in the on state. The drive circuit includes an on-period corrector configured to correct, based on the on period measured by the on-period measuring unit, the gate signal to thereby bring an actual on period of each of the upper- and lower-arm switches to approach an on-command period during which the gate signal is in the on command.

In a twelfth exemplary measure of the present disclosure, which depends from the fifth exemplary measure, the gate signal for each of the upper- and lower-arm switches has one of an on command for turning on the corresponding one of the upper- and lower-arm switches, and an off command for turning off the corresponding one of the upper- and lower-arm switches. The signal generator is configured to generate the gate signal alternately changing between the on command and the off command for alternately turning on the upper- and lower-arm switches while setting a deadtime that prevents the upper- and lower-arm switches being simultaneously in the on state. The drive circuit includes an off-period measuring unit configured to measure, based on the high/low level signal, an off period of at least one of the upper-arm switch and the lower-arm switch. The off period of the at least one of the upper-arm switch and the lower-arm switch representing a period during which the at least one of the upper-arm switch and the lower-arm switch is held in the off state. The drive circuit includes an off-period corrector configured to correct, based on the off period measured by the off-period measuring unit, the gate signal to thereby bring an actual off period of each of the upper- and lower-arm switches to approach an off-command period during which the gate signal is in the off command.

In a thirteenth exemplary measure of the present disclosure, which depends from the fifth exemplary measure, the gate signal for each of the upper- and lower-arm switches has one of an on command for turning on the corresponding one of the upper- and lower-arm switches, and an off command for turning off the corresponding one of the upper- and lower-arm switches. The signal generator is configured to generate the gate signal alternately changing between the on command and the off command for alternately turning on the upper- and lower-arm switches while setting a deadtime that prevents the upper- and lower-arm switches being simultaneously in the on state.

The drive circuit includes an on-period measuring unit configured to measure, based on the high/low level signal, an on period of at least one of the upper-arm switch and the lower-arm switch. The on period of the at least one of the upper-arm switch and the lower-arm switch represents a period during which the at least one of the upper-arm switch and the lower-arm switch is held in the on state. The drive circuit includes an off-period measuring unit configured to measure, based on the high/low level signal, an off period of the at least one of the upper-arm switch and the lower-arm switch. The off period of the at least one of the upper-arm switch and the lower-arm switch represents a period during which the at least one of the upper-arm switch and the lower-arm switch is held in the off state. The drive circuit includes a deadtime corrector configured to correct the deadtime in accordance with the on period measured by the on-period measuring unit and the off period measured by the off period measuring unit.

In accordance with the above focusing points and first to thirteenth exemplary aspects, the following describes embodiments of the present disclosure with reference to the accompanying drawings; each embodiment embodies a corresponding one of various drive circuits included in the present disclosure. In the embodiments, like parts between the embodiments, to which like reference characters are assigned, are omitted or simplified to avoid redundant description.

First Embodiment

A drive circuit according to the first embodiment is embodied as a component of a control system for controlling a rotary electric machine 10.

Referring to FIG. 1, the control system includes the rotary electric machine 10 and an inverter 20.

The control system of the first embodiment uses a brushless permanent magnet synchronous motor-generator as the rotary electric machine 10. The motor-generator includes a rotor and three-phase (UVW-phase) windings 11. For example, the rotary electric machine 10 constitutes a drive apparatus, and works to rotate the rotor to thereby drive a fan or a pump. The fan to be driven by the rotary electric machine 10 is, for example, a radiator fan or a fan of an air-conditioner installable in a vehicle compartment. The pump to be driven by the rotary electric machine 10 is, for example, an oil pump or a water pump.

The rotary electric machine 10 is electrically connected to a battery 30 serving as a direct-current (DC) power source via the inverter 20.

The inverter 20 includes three-phase (UVW-phase) series-connected switch members for the respective three-phases of the rotary electric machine 10. The series-connected switch member for each phase is comprised of an upper-arm switch SWH and a lower-arm switch SWL connected in series to each other.

The connection point between the upper- and lower-arm switches SWH and SWL for each phase is connected to a first end of the corresponding one of the three-phase stator windings 11. Opposite second ends of the three-phase windings 11 are connected to a common junction, i.e., a neutral point such that three-phase windings 11 have a phase difference of 120 electrical degrees from each other.

The first embodiment uses, as each of the upper- and lower-arm switches SWH and SWL, an N-channel MOSFET selected from various types of voltage-controlled semiconductor switches. Because an N-channel MOSFET is used as each of the upper- and lower-arm switches SWH and SWL, each of the upper- and lower-arm switches SWH and SWL has the drain as a high-side terminal, and has the source as a low-side terminal.

Upper-arm diodes DH are connected in antiparallel to the respective upper-arm switches SWH. For example, an N-channel MOSFET may constitute the upper-arm switch SWH and an intrinsic diode incorporated therein as the upper-arm diode DH. Similarly, lower-arm diodes DL are connected in antiparallel to the respective lower-arm switches SWL. For example, an N-channel MOSFET may constitute the lower-arm switch SWL and an intrinsic diode incorporated therein as the lower-arm diode DL.

The inverter 20 includes a smoothing capacitor 21 located at its input side. The capacitor 21, which has opposing high- and low-side terminals, works to smooth an input voltage to the inverter 20. The battery 30 has opposing high- and low-side terminals.

The inverter 20 has a first electric path connecting between the high-side terminal of the battery 30 and the drains of all the upper-arm switches SWH, and a second electric path connecting between the low-side terminal of the battery 30 and the sources of all the lower-arm switches SWL.

The high-side terminal of the capacitor 21 is connected to the first electric path, and the low-side terminal of the capacitor 21 is connected to the second electric path.

The control system includes a control apparatus 40. The control apparatus 40 is comprised principally of a microcomputer, and is configured to control on-off switching operations of each of the switches SWH and SWL for adjusting, through a feedback loop, a value of a controlled variable of the rotary electric machine 10 to a commanded value. The first embodiment uses an electrical angular velocity, i.e., a rotational speed, of the rotary electric machine 10 as the controlled variable thereof, and a commanded angular velocity ω* as the commanded value.

Figure 2:
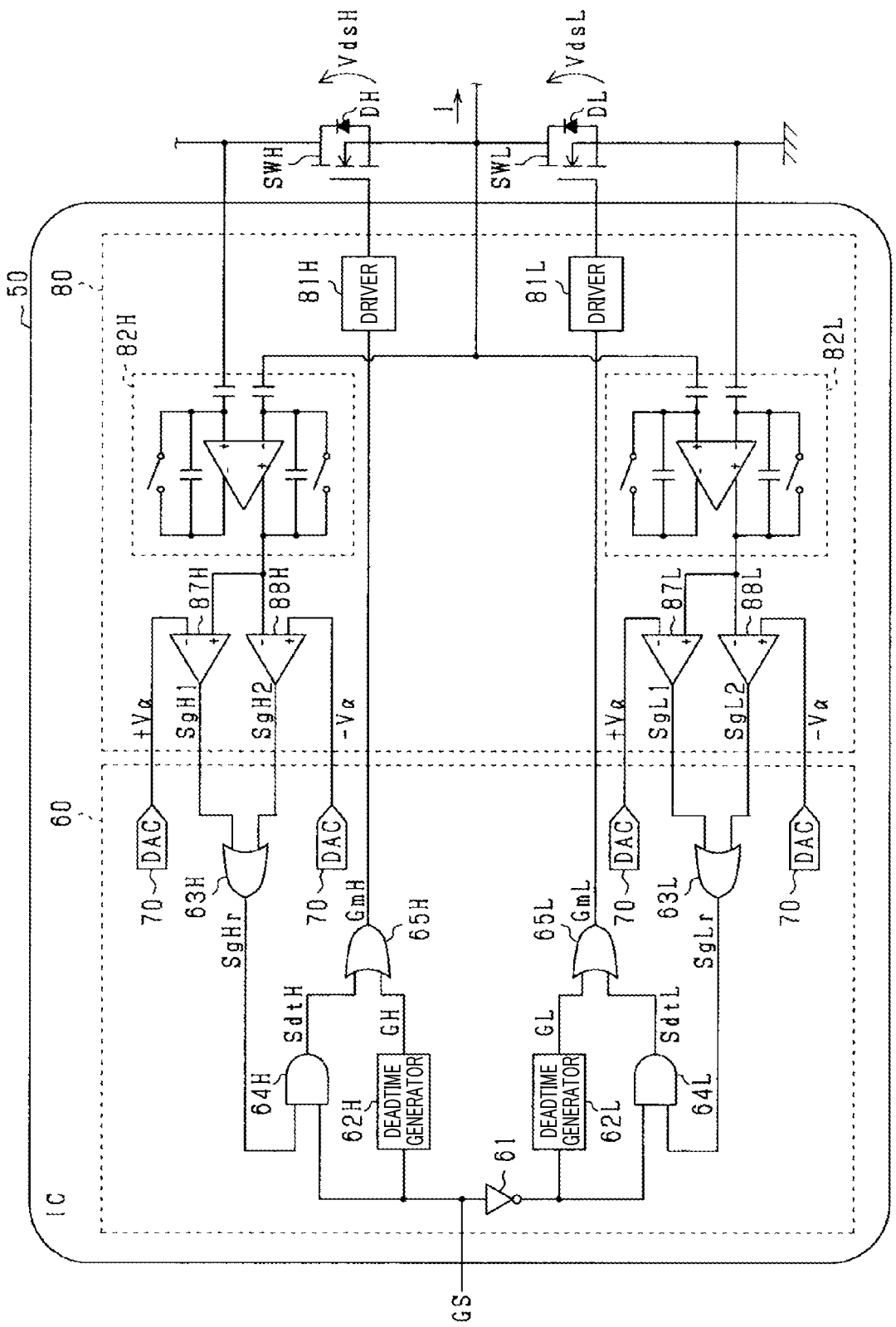
FIG. 2 is a circuit diagram of each drive IC illustrated in FIG. 1.

The inverter 20 includes, as illustrated in FIG. 2, drive integrated circuits (ICs) 50 provided for the respective phases; each of the drive ICs 50 serves as a drive circuit.

Specifically, the control apparatus 40 outputs a drive signal GS to each drive IC 50 for the upper- and lower-arm switches SWH and SWL of the corresponding phase.

The drive signal GS is comprised of alternant logical high levels and logical low levels. Each logical high level of the drive signal GS for the upper- and lower-arm switches SWH and SWL represents an on command for instructing turn-on of the upper-arm switch SWH and turn-off of the lower-arm switch SWL. Each logical low level L of the drive signal GS represents an off command for instructing turn-off of the upper-arm switch SWH and turn-on of the lower-arm switch SWL.

For example, the set of software programs stored in a tangible memory and one or more computers for executing the software programs included in the control apparatus 40 can offer the functions installed therein. Hardware devices included in the control apparatus 40 can offer the functions installed therein. The combination of the set of the software programs and one or more computers and the hardware devices included in the control apparatus 40 can offer the functions installed therein.

Each drive IC 50 includes a logic unit 60 and an analog unit 80.

The logic unit 60 includes a logic inverter 61, an upper-arm deadtime generator 62H, and a lower-arm deadtime generator 62L.

Figure 4A:
FIG. 4A is a timing chart schematically illustrating how a drive signal is changed over time.
Figure 4B:
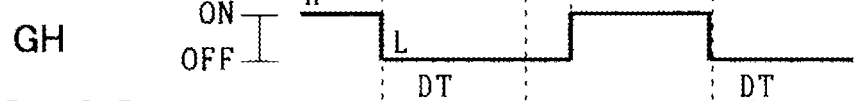
FIG. 4B is a timing chart schematically illustrating how an upper-arm drive signal is changed over time.

The upper-arm deadtime generator 62H is, as illustrated in FIGS. 4A and 4B, configured to delay, by a predetermined deadtime DT, each timing of switching a corresponding one of the logical low levels in the drive signal GS inputted thereto to a corresponding one of the logical high levels, thus generating an upper-arm drive signal GH.

The logic inverter 61 is configured to invert the high and low logical levels of the drive signal GS inputted thereto, and output, as an output signal, the logically inverted drive signal to the lower-arm deadtime generator 62L.

Figure 4C:
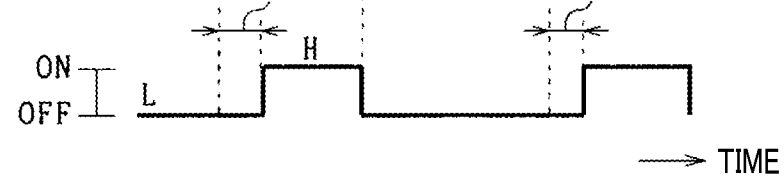
FIG. 4C is a timing chart schematically illustrating how a lower-arm drive signal is changed over time.

The lower-arm deadtime generator 62L is, as illustrated in FIGS. 4A and 4C, configured to delay, by the predetermined deadtime DT, each timing of switching a corresponding one of the logical high levels in the output signal, i.e., the logically inverted drive signal, of the logic inverter 61 to a corresponding one of the logical low levels, thus generating a lower-arm drive signal GL.

The logic unit 60 additionally includes a first upper-arm OR circuit 63H, an upper-arm AND circuit 64H, a second upper-arm OR circuit 65H, a first lower-arm OR circuit 63L, a lower-arm AND circuit 64L, and a second lower-arm OR circuit 65L.

The drive signal GS and an output signal SgHr from the first upper-arm OR circuit 63H are inputted to the upper-arm AND circuit 64H. The logically inverted drive signal outputted from the logic inverter 61 and an output signal SgLr from the first lower-arm OR circuit 63L are inputted to the lower-arm AND circuit 64L.

The upper-arm drive signal GH outputted from the upper-arm deadtime generator 62H and an output signal SdtH from the upper-arm AND circuit 64H are inputted to the second upper-arm OR circuit 65H. An output signal from the second upper-arm OR circuit 65H serves as an upper-arm gate signal GmH.

The lower-arm drive signal GL outputted from the lower-arm deadtime generator 62L and an output signal SdtL from the lower-arm AND circuit 64L are inputted to the second lower-arm OR circuit 65L. An output signal from the second lower-arm OR circuit 65L serves as a lower-arm gate signal GmL.

The analog unit 80 includes an upper-arm driver 81H and a lower-arm driver 81L.

The upper-arm driver 81H receives the upper-arm gate signal GmH outputted from the second upper-arm OR circuit 65H, and determines whether the logical level of the upper-arm gate signal GmH represents the logical high level or the logical low level.

When determining that the logical level of the upper-arm gate signal GmH represents the logical high level, the upper-arm driver 81H determines that the upper-arm gate signal GmH represents the on command to accordingly supply a charge current to the gate of the upper-arm switch SWH. This causes the upper-arm switch SWH to be turned on.

In contrast, when determining that the logical level of the upper-arm gate signal GmH represents the logical low level, the upper-arm driver 81H determines that the upper-arm gate signal GmH represents the off command to accordingly cause a discharge current to flow from the gate of the upper-arm switch SWH. This causes the upper-arm switch SWH to be turned off.

The lower-arm driver 81L receives the lower-arm gate signal GmL outputted from the second lower-arm OR circuit 65L, and determines whether the logical level of the lower-arm gate signal GmL represents the logical high level or the logical low level.

When determining that the logical level of the lower-arm gate signal GmL represents the logical high level, the lower-arm driver 81L determines that the lower-arm gate signal GmL represents the on command to accordingly supply a charge current to the gate of the lower-arm switch SWL. This causes the lower-arm switch SWL to be turned on.

In contrast, when determining that the logical level of the lower-arm gate signal GmL represents the logical low level, the lower-arm driver 81L determines that the lower-arm gate signal GmL represents the off command to accordingly cause a discharge current to flow from the gate of the lower-arm switch SWL. This causes the lower-arm switch SWL to be turned off.

The analog unit 80 includes an upper-arm detector 82H and a lower-arm detector 82L, each of which corresponds to a differential circuit. The configuration of the upper-arm detector 82H according to the first embodiment is the same as that of the lower-arm detector 82L. The following therefore describes, in detail, the upper-arm detector 82H as an example.

Figure 3:
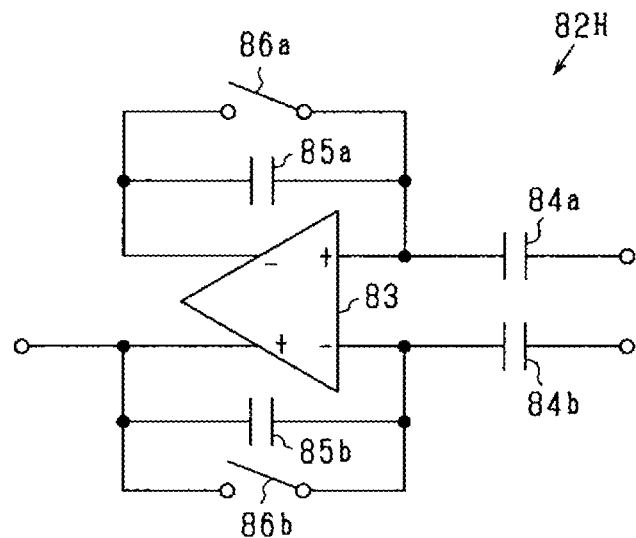
FIG. 3 is a circuit diagram of an upper-arm detector illustrated in FIG. 2.

The upper-arm detector 82H is, as illustrated in FIG. 3, comprised of a fully differential amplifier 83, first and second input capacitors 84a and 84b, first and second hold capacitors 85a and 85b, and first and second reset switches 86a and 86b.

Each of capacitors 84a, 84b, 85a, and 85b has opposing first and second ends. The fully differential amplifier 83 has a positive input terminal, a negative input terminal, a positive output terminal, and a negative output terminal.

The positive input terminal, which serves as a first input terminal, of the fully differential amplifier 83 and the first terminal of the first hold capacitor 85a are connected to the first terminal of the first input capacitor 84a. The drain of the upper-arm switch SWH is connected to the second terminal of the first input capacitor 84a. The negative output terminal, which serves as a first output terminal, of the fully differential amplifier 83 is connected to the second terminal of the first hold capacitor 85a. The first reset switch 86a is connected in parallel to the first hold capacitor 85a.

The negative input terminal, which serves as a second input terminal, of the fully differential amplifier 83 and the first terminal of the second hold capacitor 85b are connected to the first terminal of the second input capacitor 84b. The source of the upper-arm switch SWH is connected to the second terminal of the second input capacitor 84b. The positive output terminal, which serves as a second output terminal, of the fully differential amplifier 83 is connected to the second terminal of the second hold capacitor 85b. The second reset switch 86b is connected in parallel to the second hold capacitor 85b.

Each of the first and second input capacitors 84a and 84b according to the first embodiment has the same capacitance C1, and each of the first and second hold capacitors 85a and 85b according to the first embodiment has the same capacitance C2.

Let us assume that

1. An input voltage at the negative input terminal of the fully differential amplifier 83 is referred to as ViL 2. An input voltage at the positive input terminal of the fully differential amplifier 83 is referred to as ViH 3. An analog voltage to be outputted from the positive output terminal of the fully differential amplifier 83 is referred to as Vo 4. An amplification factor of the fully differential amplifier 83 is referred to as C1/C2

This assumption enables the following relationship to be established:

$$Vo = (C1/C2) \times (ViH - ViL)$$

where (ViH–ViL) denotes the difference of the input voltage ViL from the input voltage ViH.

For the sake of simplicity, the amplification factor C1/C2 amplification factor of the fully differential amplifier 83 is set to 1.

Turning on each of the reset switches 86a and 86b results in the output voltage Vo at the positive output terminal of the fully differential amplifier 83 becomes 0 V. Hereinafter, turning on of each of the reset switches 86a and 86b will also be referred to as an execution of resetting the upper-arm detector 82H.

After execution of resetting the upper-arm detector 82H, each of the reset switches 86a and 86b is turned off. Turning off of each of the reset switches 86a and 86b will also be referred to as a cancelation of the resetting of the upper-arm detector 82H.

The upper-arm detector 82H is configured to

1. Monitor, as a reference voltage, the difference (ViH–ViL) of the input voltage ViL from the input voltage ViH at the timing of cancelling the resetting of the upper-arm detector 82H 2. Multiply, by the amplification factor C1/C2, a voltage change from the monitored reference voltage to accordingly obtain the product of the voltage change and the amplification factor C1/C2 as the output voltage Vo The difference (ViH–ViL) of the input voltage ViL from the input voltage ViH represents a voltage VdsH between the drain and the source, which will be referred to as a drain-source voltage VdsH, of the upper-arm switch SWH.

Returning to FIG. 2, the analog unit 80 a first upper-arm comparator 87H, a second upper-arm comparator 88H, a first lower-arm comparator 87L, and a second lower-arm comparator 88L.

Each of the comparators 87H, 87L, 88H, and 88L has a non-inverting input terminal, an inverting input terminal, and an output terminal.

The logic unit 60 further includes a threshold setter 70 for setting first and second thresholds used in each of the upper- and lower-arm detectors 80H and 80L; the first threshold according to the first embodiment is a positive threshold Vα, and the second threshold according to the first embodiment is a negative threshold −Vα.

The output voltage outputted from the positive output terminal of the upper-arm detector 82H is inputted to the non-inverting input terminal of the first upper-arm comparator 87H. The positive threshold Vα set by the threshold setter 70 is inputted to the inverting input terminal of the first upper-arm comparator 87H.

The output voltage outputted from the positive output terminal of the upper-arm detector 82H is also inputted to the inverting input terminal of the second upper-arm comparator 88H. The negative threshold −Vα set by the threshold setter 70 is inputted to the non-inverting input terminal of the second upper-arm comparator 88H. An absolute value of the negative threshold −Vα according to the first embodiment is set to be identical to the positive threshold Vα.

The first upper-arm comparator 87H is configured to output a signal SgH1, and the second upper-arm comparator 88H is configured to output a signal SgH2. Both the output signals SgH1 and SgH2 are inputted to the first upper-arm OR circuit 63H.

In particular, the positive threshold Vα is set to be more than 0 V and less than a lower limit of a predetermined range within which a voltage drop across the upper-arm diode DH can vary. For example, the positive threshold Vα is set to 0.4 V. The voltage drop across the upper-arm diode DH is set to be higher than a value of the drain-source voltage VdsH of the upper-arm switch SWH in which a current is flowing between the drain and source of the upper-arm switch SWH.

An output voltage outputted from the positive output terminal of the lower-arm detector 82L is inputted to the non-inverting input terminal of the first lower-arm comparator 87L. The positive threshold Vα set by the threshold setter 70 is inputted to the inverting input terminal of the first lower-arm comparator 87L.

The output voltage outputted from the positive output terminal of the lower-arm detector 82L is also inputted to the inverting input terminal of the second lower-arm comparator 88L. The negative threshold −Vα set by the threshold setter 70 is inputted to the non-inverting input terminal of the second lower-arm comparator 88L.

The first lower-arm comparator 87L is configured to output a signal SgL1, and the second lower-arm comparator 88L is configured to output a signal SgL2. Both the output signals SgL1 and SgL2 are inputted to the first lower-arm OR circuit 63L.

The logic unit 60 and the comparators 87H, 87L, 88H, and 88L serve as a signal generator.

Next, the following describes how the drive IC 50 operates using FIGS. 5 and 6. Hereinafter, a power-supply voltage VDC, which denotes a voltage across the battery 30, is set to 12 V.

First, the following describes how the drive IC 50 operates while the polarity of a current I flowing between the three-phase windings 11 and the connection point between the upper- and lower-arm switches SWH and SWL is positive using FIGS. 5A to 5M. The polarity of the current I being positive represents the current I flowing from the connection point between the upper- and lower-arm switches SWH and SWL to the three-phase windings 11.

FIG. 5A represents how each of the drain-source voltage VdsH of the upper-arm switch SWH and the upper-arm drive signal GH is changed over time.

FIG. 5B represents how the upper-arm detector 82H is reset (see "ON" in FIG. 5B) over time, and how the resetting of the upper-arm detector 82H is cancelled over time (see "OFF" in FIG. 5B).

FIG. 5C represents how the output signal SgH1 from the first upper-arm comparator 87H is changed over time.

FIG. 5D represents how the output signal SgH2 from the second upper-arm comparator 88H is changed over time.

FIG. 5E represents how the output signal SgHr from the first upper-arm OR circuit 63H is changed over time.

FIG. 5F represents how each of a drain-source voltage VdsL of the lower-arm switch SWL and the lower-arm drive signal GL is changed over time.

FIG. 5G represents how the lower-arm detector 82L is reset (see ON" in FIG. 5G) over time, and how the resetting of the lower-arm detector 82L is cancelled over time (see "OFF" in FIG. 5G).

FIG. 5H represents how the output signal SgL1 from the first lower-arm comparator 87L is changed over time.

FIG. 5I represents how the output signal SgL2 from the second lower-arm comparator 88L is changed over time.

FIG. 5J represents how the output signal SgLr from the first lower-arm OR circuit 63L is changed over time.

FIG. 5K represents how the output signal SdtH from the upper-arm AND circuit 64H is changed over time.

FIG. 5M represents how the output signal SdtL from the lower-arm AND circuit 64L is changed over time.

Referring to FIGS. 5A to 5M, before time t1, the upper-arm drive signal GH is in the logical low level, and the lower-arm drive signal GL is in the logical high level. Before the time t1, the upper-arm switch SWH is in the off state, and the lower-arm switch SWL is in the on state. This results in the drain-source voltage VdsH of the upper-arm switch SWH being the power-supply voltage VDC of 12 V, and the drain-source voltage VdsL of the lower-arm switch SWL being 0 V.

At the time t1, resetting of each of the upper- and lower-arm detectors 82H and 82L is carried out. This resetting causes the logical high level of the output signal SgH1 of the first upper-arm comparator 87H to be inverted to the logical low level, resulting in the logical high level of the output signal SgHr of the first upper-arm OR circuit 63H being inverted to the logical low level.

At time t2, the resetting of each of the upper- and lower-arm detectors 82H and 82L is cancelled. This cancelling causes 1. The upper-arm detector 82H to output a voltage change from a reference voltage of 12 V, which is a value of the drain-source voltage VdsH of the upper-arm switch SWH at the time t2

2. The lower-arm detector 82L to output a voltage change from a reference voltage of 0 V, which is a value of the drain-source voltage VdsL of the lower-arm switch SWL at the time t2

At time t3, the logical high level of the lower-arm drive signal GL is inverted to the logical low level, so that the lower-arm switch SWL is switched from the on state to the off state. This causes a current to flow through the lower-arm diode DL, resulting in the drain-source voltage VdsL across the lower-arm switch SWL becoming a predetermined negative voltage of $-\Delta di$. The absolute value $\Delta di$ of the negative voltage of $-\Delta di$ represents a voltage drop across the lower-arm diode DL, which is set to 0.7 V according to the first embodiment. The turning off of the lower-arm switch SWL causes the drain-source voltage VdsH of the upper-arm switch SWH to be changed from the power-supply voltage VDC of 12 V to a predetermined voltage of (VDC+$\Delta di$), which is 12.7 V.

The start of a current flowing through the lower-arm diode DL causes the output voltage of the upper-arm detector 82H to start to rise toward 0.7 V. This results in the output voltage of the upper-arm detector 82H becoming higher than the positive threshold V$\alpha$ of 0.4 V at time t4. This causes the logical low level of the output signal SgH1 of the first upper-arm comparator 87H to be inverted to the logical high level, resulting in the logical low level of the output signal SgHr of the first upper-arm OR circuit 63H being inverted to the logical high level. This results in the logical low level of the output signal SdtH of the upper-arm AND circuit 64H being inverted to the logical high level. This causes the logical low level of the upper-arm gate signal GmH to be inverted to the logical high level at the time t4 earlier than time t6 at which the logical low level of the upper-arm drive signal GH is scheduled to be inverted to the logical high level. This enables the upper-arm switch SWH to be switched from the off state to the on state earlier than the time t6, making it possible to reduce actual deadtimes for the upper- and lower-arm switches SWH and SWL.

In particular, the first embodiment is configured to compare the voltage change from the reference voltage (12 V) with the positive threshold V$\alpha$. This configuration enables more immediate determination that the lower-arm switch SWL is changed from the on state to the off state, making it possible to further reduce the actual deadtimes for the upper- and lower-arm switches SWH and SWL.

Switching the upper-arm switch SWH from the off state to the on state causes the drain-source voltage VdsH of the upper-arm switch SWH to start to fall from 12.7 V toward 0 V. This causes the output voltage of the upper-arm detector 82H to start to fall from 0.7 V toward −VDC (−12 V), and thereafter become lower than the positive threshold V$\alpha$ of 0.4 V. This causes the logical high level of the output signal SgH1 of the first upper-arm comparator 87H to be inverted to the logical low level.

Immediately after the logical inversion of the output signal SgH1 from the logical high level to the logical low level, the output voltage of the upper-arm detector 82H becomes lower than −0.4 V, so that the logical low level of the output signal SgH2 of the second upper-arm comparator 88H is inverted to the logical high level. Because a time defined from the timing at which the output voltage of the upper-arm detector 82H becomes lower than 0.4 V to the timing at which the output voltage of the upper-arm detector 82H becomes lower than −0.4 V is extremely short, the first embodiment enables the logical high level of the output signal SgHr of the first upper-arm OR circuit 63H to have been continuously maintained since the time t4.

The start of the current flowing through the lower-arm diode DL also causes the output voltage of the lower-arm detector 82L to start to fall toward −0.7 V. This results in the output voltage of the lower-arm detector 82L becoming lower than the negative threshold −V$\alpha$ of −0.4 V at the time t4. This causes the logical low level of the output signal SgH2 of the second lower-arm comparator 88L to be inverted to the logical high level, resulting in the logical low level of the output signal SgLr of the first lower-arm OR circuit 63L being inverted to the logical high level. Because, however, the output signal of the logic inverter 60 has the logical low level, the logical low level of the output signal SdtL of the lower-arm AND circuit 64L is maintained without being inverted to the logical high level.

Thereafter, switching the upper-arm switch SWH from the off state to the on state causes the drain-source voltage VdsL of the lower-arm switch SWL to rise up to the power-supply voltage VDC of 12 V, so that the output voltage of the lower-arm detector 82L starts to rise from −0.7 V to 12 V and thereafter become higher than the negative threshold −V$\alpha$ of −0.4 V. This causes the logical high level of the output signal SgL2 of the second lower-arm comparator 88L to be inverted to the logical low level.

Immediately after the logical inversion of the output signal SgH2 from the logical high level to the logical low level, the output voltage of the lower-arm detector 82L becomes higher than 0.4 V, so that the logical low level of the output signal SgL1 of the first lower-arm comparator 87L is inverted to the logical high level. This results in the logical high level of the output signal SgLr of the first lower-arm OR circuit 63L being maintained without being inverted to the logical low level.

Thereafter, resetting of each of the upper- and lower-arm detectors 82H and 82L is carried out at time t7. This resetting causes the logical high level of the output signal SgH2 of the second upper-arm comparator 88H to be inverted to the logical low level, resulting in the logical high level of the output signal SgHr of the first upper-arm OR circuit 63H being inverted to the logical low level. This results in the logical high level of the output signal SdtH of the upper-arm AND circuit 64H being inverted to the logical low level.

At time t8, the resetting of each of the upper- and lower-arm detectors 82H and 82L is cancelled. This cancelling causes 1. The upper-arm detector 82H to output a voltage change from the reference voltage of 0 V, which is a value of the drain-source voltage VdsH of the upper-arm switch SWH at the time t8

2. The lower-arm detector 82L to output a voltage change from the first reference voltage of 12 V, which is a value of the drain-source voltage VdsL of the lower-arm switch SWL at the time t8

At time t9, the logical high level of the upper-arm drive signal GH is inverted to the logical low level, so that the upper-arm switch SWH is switched from the on state to the off state. This causes a current to flow through the lower-arm diode DL, resulting in the drain-source voltage VdsL across the lower-arm switch SWL being changed from zero to −0.7 V, and the drain-source voltage VdsH of the upper-arm switch SWH becoming 12.7 V.

The start of a current flowing through the lower-arm diode DL causes the output voltage of the lower-arm detector 82L to start to fall toward −0.7 V. This results in the output voltage of the lower-arm detector 82L becoming lower than the negative threshold −Vα of −0.4 V at time t10. This causes the logical low level of the output signal SgL2 of the second lower-arm comparator 88L to be inverted to the logical high level, resulting in the logical low level of the output signal SgLr of the first lower-arm OR circuit 63L being inverted to the logical high level. This results in the logical low level of the output signal SdtL of the lower-arm AND circuit 64L being inverted to the logical high level. This causes the logical low level of the lower-arm gate signal GmL to be inverted to the logical high level at the time t10 earlier than time t12 at which the logical low level of the lower-arm drive signal GL is scheduled to be inverted to the logical high level. This enables the lower-arm switch SWL to be switched from the off state to the on state earlier than the time t12, making it possible to reduce the actual deadtimes for the upper- and lower-arm switches SWH and SWL.

In particular, the first embodiment is configured to compare the voltage change from the reference voltage (12 V) with the negative threshold −Vα. This configuration enables more immediate determination that the upper-arm switch SWH is changed from the on state to the off state, making it possible to further reduce the actual deadtimes for the upper- and lower-arm switches SWH and SWL.

The start of the current flowing through the lower-arm diode DL also causes the output voltage of the upper-arm detector 82H to start to rise from 0V to 12 V. This results in the output voltage of the upper-arm detector 82H exceeding the positive threshold Vα of 0.4 V at the time t10. This causes the logical low level of the output signal SgH1 of the first upper-arm comparator 87H to be inverted to the logical high level, resulting in the logical low level of the output signal SgHr of the first upper-arm OR circuit 63H being inverted to the logical high level. Because, however, the drive signal GS has the logical low level, the logical low level of the output signal SdtH of the upper-arm AND circuit 64H is maintained without being inverted to the logical high level.

The turning on of the lower-arm switch SWL causes the current to be changed to flow from the lower-arm diode DL to the lower-arm switch SWL, resulting in the drain-source voltage VdsL of the lower-arm switch SWL becoming zero at time t11.

Next, the following describes how the drive IC 50 operates while the polarity of the current I flowing between the three-phase windings 11 and the connection point between the upper- and lower-arm switches SWH and SWL is negative using FIGS. 6A to 6M. FIGS. 6A to 6M respectively correspond to FIGS. 5A to 5M.

Referring to FIGS. 6A to 6J, before time t1, the upper-arm drive signal GH is in the logical low level, and the lower-arm drive signal GL is in the logical high level. Before the time t1, the upper-arm switch SWH is in the off state, and the lower-arm switch SWL is in the on state. This results in the drain-source voltage VdsH of the upper-arm switch SWH being the power-supply voltage VDC of 12 V, and the drain-source voltage VdsL of the lower-arm switch SWL being 0 V.

At the time t1, resetting of each of the upper- and lower-arm detectors 82H and 82L is carried out. This resetting causes the logical high level of the output signal SgH1 of the first upper-arm comparator 87H to be inverted to the logical low level, resulting in the logical high level of the output signal SgHr of the first upper-arm OR circuit 63H being inverted to the logical low level.

At time t2, the resetting of each of the upper- and lower-arm detectors 82H and 82L is cancelled. This cancelling causes 1. The upper-arm detector 82H to output a voltage change from the reference voltage of 12 V, which is a value of the drain-source voltage VdsH of the upper-arm switch SWH at the time t2

2. The lower-arm detector 82L to output a voltage change from the reference voltage of 0 V, which is a value of the drain-source voltage VdsL of the lower-arm switch SWL at the time t2

At time t3, the logical high level of the lower-arm drive signal GL is inverted to the logical low level, so that the lower-arm switch SWL is switched from the on state to the off state. This causes a current to flow through the upper-arm diode DH, resulting in the drain-source voltage VdsH across the upper-arm switch SWH becoming the predetermined negative voltage of −Δdi. The absolute value Δdi of the negative voltage of −Δdi represents a voltage drop across the upper-arm diode DH. Like the lower-arm diode DL, the absolute value Δdi of the negative voltage of −Δdi is set to 0.7 V according to the first embodiment.

The start of a current flowing through the upper-arm diode DH causes the output voltage of the upper-arm detector 82H to start to fall from the 12 V toward −0.7 V. This results in the output voltage of the upper-arm detector 82H becoming lower than the negative threshold −Vα of −0.4 V at time t4. This causes the logical low level of the output signal SgH2 of the second upper-arm comparator 88H to be inverted to the logical high level, resulting in the logical low level of the output signal SgHr of the first upper-arm OR circuit 63H being inverted to the logical high level. This results in the logical low level of the output signal SdtH of the upper-arm AND circuit 64H being inverted to the logical high level. This causes the logical low level of the upper-arm gate signal GmH to be inverted to the logical high level at the time t4 earlier than time t6 at which the logical low level of the upper-arm drive signal GH is scheduled to be inverted to the logical high level. This enables the upper-arm switch SWH to be switched from the off state to the on state earlier than the time t6, making it possible to reduce the actual deadtimes for the upper- and lower-arm switches SWH and SWL.

After the time t4, the drain-source voltage VdsH of the upper-arm switch SWH increases to reach 0 V at time t5.

At the time t4, the logical low level of the output signal SgL1 of the first lower-arm comparator 87L is inverted to the logical high level, resulting in the logical low level of the output signal SgLr of the first lower-arm OR circuit 63L being inverted to the logical high level. Because, however, the output signal of the logic inverter 61 has the logical low level, the logical low level of the output signal SdtL of the lower-arm AND circuit 64L is maintained without being inverted to the logical high level.

Thereafter, resetting of each of the upper- and lower-arm detectors 82H and 82L is carried out at time t7. This resetting causes the logical high level of the output signal SgH2 of the second upper-arm comparator 88H to be inverted to the logical low level, resulting in the logical high level of the output signal SgHr of the first upper-arm OR circuit 63H being inverted to the logical low level. The resetting also causes the logical high level of the output signal SgL1 of the first lower-arm comparator 87L to be inverted to the logical low level, resulting in the output signal SgLr of the first lower-arm OR circuit 63L being inverted to the logical low level.

At time t8, the resetting of each of the upper- and lower-arm detectors 82H and 82L is cancelled. This cancelling causes 1. The upper-arm detector 82H to output a voltage change from the reference voltage of 0 V, which is a value of the drain-source voltage VdsH of the upper-arm switch SWH at the time t8

2. The lower-arm detector 82L to output a voltage change from the reference voltage of 12 V, which is a value of the drain-source voltage VdsL of the lower-arm switch SWL at the time t8

At time t9, the logical high level of the upper-arm drive signal GH is inverted to the logical low level, so that the upper-arm switch SWH is switched from the on state to the off state. This causes a current to flow through the upper-arm diode DH, resulting in the drain-source voltage VdsH across the upper-arm switch SWH being changed from zero to −0.7 V, and the drain-source voltage VdsL of the lower-arm switch SWL becoming 12.7 V.

The start of a current flowing through the upper-arm diode DH causes the output voltage of the lower-arm detector 82L to start to rise toward 0.7 V. This results in the output voltage of the lower-arm detector 82L becoming higher than the positive threshold $V\alpha$ of 0.4 V at time t10. This causes the logical low level of the output signal SgL1 of the first lower-arm comparator 87L to be inverted to the logical high level, resulting in the logical low level of the output signal SgLr of the first lower-arm OR circuit 63L being inverted to the logical high level. This results in the logical low level of the output signal SdtL of the lower-arm AND circuit 64L being inverted to the logical high level. This causes the logical low level of the lower-arm gate signal GmL to be inverted to the logical high level at the time t10 earlier than time t12 at which the logical low level of the lower-arm drive signal GL is scheduled to be inverted to the logical high level. This enables the lower-arm switch SWL to be switched from the off state to the on state earlier than the time t12, making it possible to reduce the actual deadtimes for the upper- and lower-arm switches SWH and SWL.

The turning off of the upper-arm switch SWH causes the drain-source voltage VdsL of the lower-arm switch SWL to start to fall toward 0 V. This causes the output voltage of the upper-arm detector 82H to start to fall from 0.7 V toward −VDC (−12 V), and thereafter become lower than the positive threshold $V\alpha$ of 0.4 V. This causes the logical high level of the output signal SgL1 of the first lower-arm comparator 87L to be inverted to the logical low level.

Immediately after the logical inversion of the output signal SgL1 from the logical high level to the logical low level, the output voltage of the lower-arm detector 82L becomes lower than −0.4 V, so that the logical low level of the output signal SgH2 of the second upper-arm comparator 88H is inverted to the logical high level. Because, however, a time defined from the timing at which the output voltage of the lower-arm detector 82L becomes lower than 0.4 V to the timing at which the output voltage of the lower-arm detector 82L becomes lower than −0.4 V is extremely short, the first embodiment enables the logical high level of the output signal SgLr of the first upper-arm OR circuit 63L to have been continuously maintained since the time t10.

Additionally, at the time t10, the logical low level of the output signal ShH2 of the second upper-arm comparator 88H is inverted to the logical high level, so that the logical low level of the output signal SgHr of the first upper-arm OR circuit 63H is inverted to the logical high level. Because, however, the drive signal GS has the logical low level, the logical low level of the output signal SdtH of the upper-arm AND circuit 64H is maintained without being inverted to the logical high level.

The first embodiment described above achieves the following advantageous benefits.

Specifically, each drive IC 50 according to the first embodiment is configured such that 1. A voltage at the drain of the upper-arm switch SWH, which has been divided based on the first input capacitor 84a and the first hold capacitor 85a, is inputted to the fully differential amplifier 83 of the upper-arm detector 82H 2. A voltage at the source of the upper-arm switch SWH, which has been divided based on the second input capacitor 84b and the second hold capacitor 85b, is inputted to the fully differential amplifier 83 of the upper-arm detector 82H In particular, each drive IC 50 according to the first embodiment is configured such that 1. The first input capacitor 84a enables an alternating-current (AC) voltage component in the voltage at the drain of the of the upper-arm switch SWH to be inputted to the fully differential amplifier 83 of the upper-arm detector 82H 2. The second input capacitor 84b enables an AC voltage component in the voltage at the source of the of the upper-arm switch SWH to be inputted to the fully differential amplifier 83 of the upper-arm detector 82H This therefore enables the fully differential amplifier 83 to have a smaller withstand voltage range, making it possible for the fully differential amplifier 83 to have a smaller size.

Each drive IC 50 according to the first embodiment is configured to have a reset function that enables a voltage change relative to the reference voltage of 0 V or 12 V to be compared with the positive threshold $V\alpha$ or the negative threshold $-V\alpha$. This configuration additionally contributes to the smaller withstand voltage range of each fully differential amplifier 83, thus contributing to the smaller size of the corresponding fully differential amplifier 83.

The smaller size of each fully differential amplifier 83 makes it easier to incorporate the logic unit 60 and the analog unit 80 in a single chip as the drive IC 50.

The reset function of each drive IC 50, which enables a voltage change relative to the reference voltage of 0 V or 12 V to be compared with the positive threshold $V\alpha$ or the negative threshold −Vα, enables rapid detection of switching of an approaching turn-on switch from the off state to the on state; the approaching turn-on switch is one of the upper- and lower-arm switches SWH and SWL while the other thereof is in the on state. This therefore results in a reduction in the actual deadtimes between the upper- and lower-arm switches SWH and SWL, making it possible to reduce both electrical losses in the inverter 20 and distortion in currents flowing through the respective windings 11.

Each drive IC 50 according to the first embodiment is configured to

1. Reset each of the upper- and lower-arm detectors 82H and 82L while a selected one of the upper- and lower-arm switches SWH and SWL is in the on state 2. Cancel the resetting of each of the upper- and lower-arm detectors 82H and 82L until the selected one of the upper- and lower-arm switches SWH and SWL is switched from the on state to the off state This configuration therefore makes it possible to reliably detect turning on of the approaching turn-on switch, which is the other of the upper- and lower-arm switches SWH and SWL.

First Modification of First Embodiment

Figure 7:
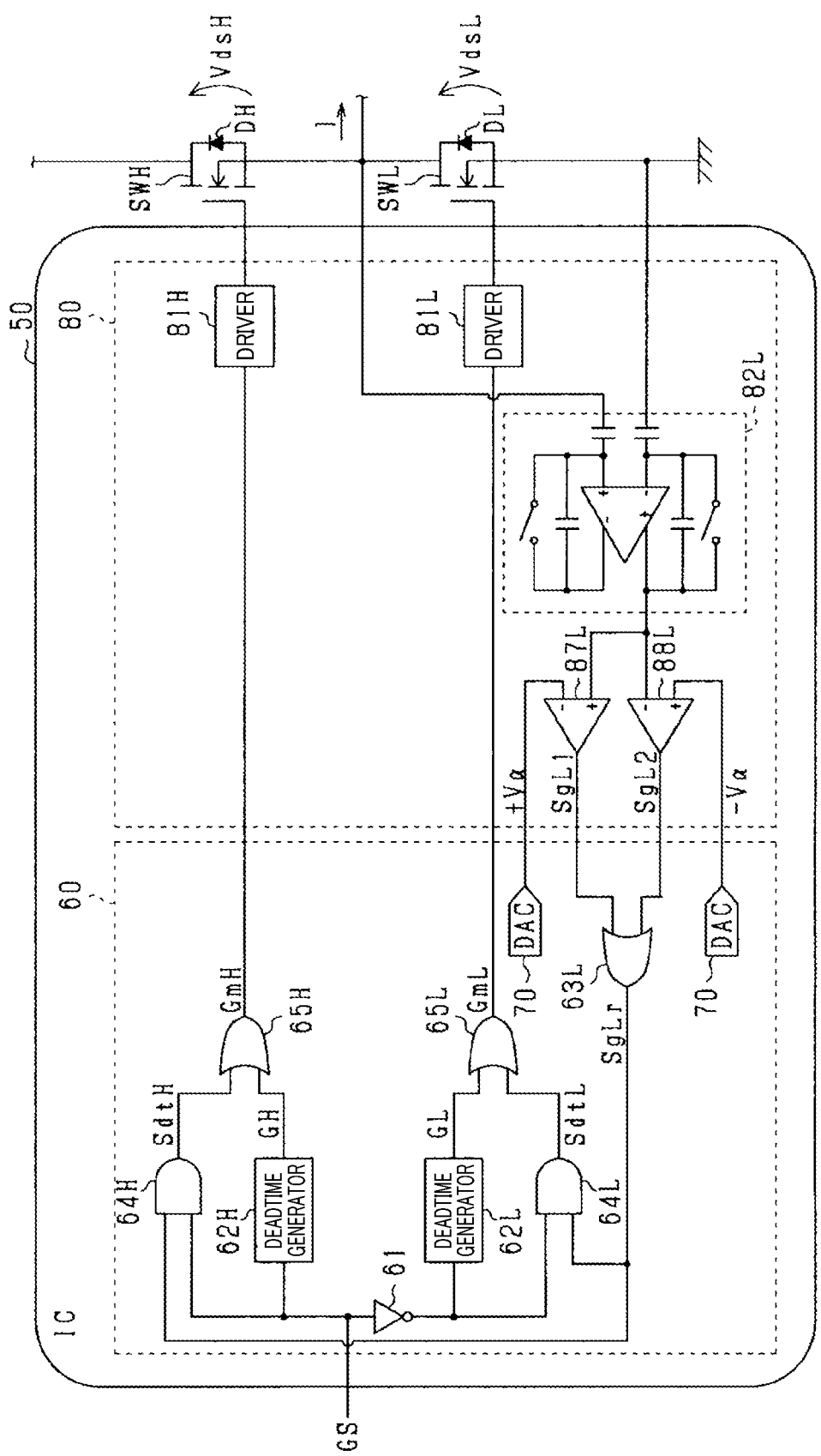
FIG. 7 is a circuit diagram of each drive IC according to the first modification of the first embodiment.

Referring to FIG. 7, each drive IC 50 according to a first modification of the first embodiment is configured not to include the upper-arm detector 82H, the first upper-arm comparator 87H, the second upper-arm comparator 88H, and the first upper-arm OR circuit 63H.

Each of the remaining elements of each drive IC 50 illustrated in FIG. 7 has the same configuration as the corresponding one of the elements illustrated in FIG. 2. For this reason, reference characters assigned to the respective elements illustrated in FIG. 2 are also assigned to the corresponding respective remaining elements illustrated in FIG. 7.

Each drive IC 50 according to the first modification of the first embodiment is configured such that the output signal SgLr of the first lower-arm OR circuit 63L is inputted to the upper-arm AND circuit 64H in place of the output signal SgHr of the first upper-arm OR circuit 63H.

Each drive IC 50 of the first modification of the first embodiment makes it possible to reduce the number of elements in the corresponding drive IC 50 while reducing the actual deadtimes between the upper- and lower-arm switches SWH and SWL.

Second Modification of First Embodiment

Figure 8:
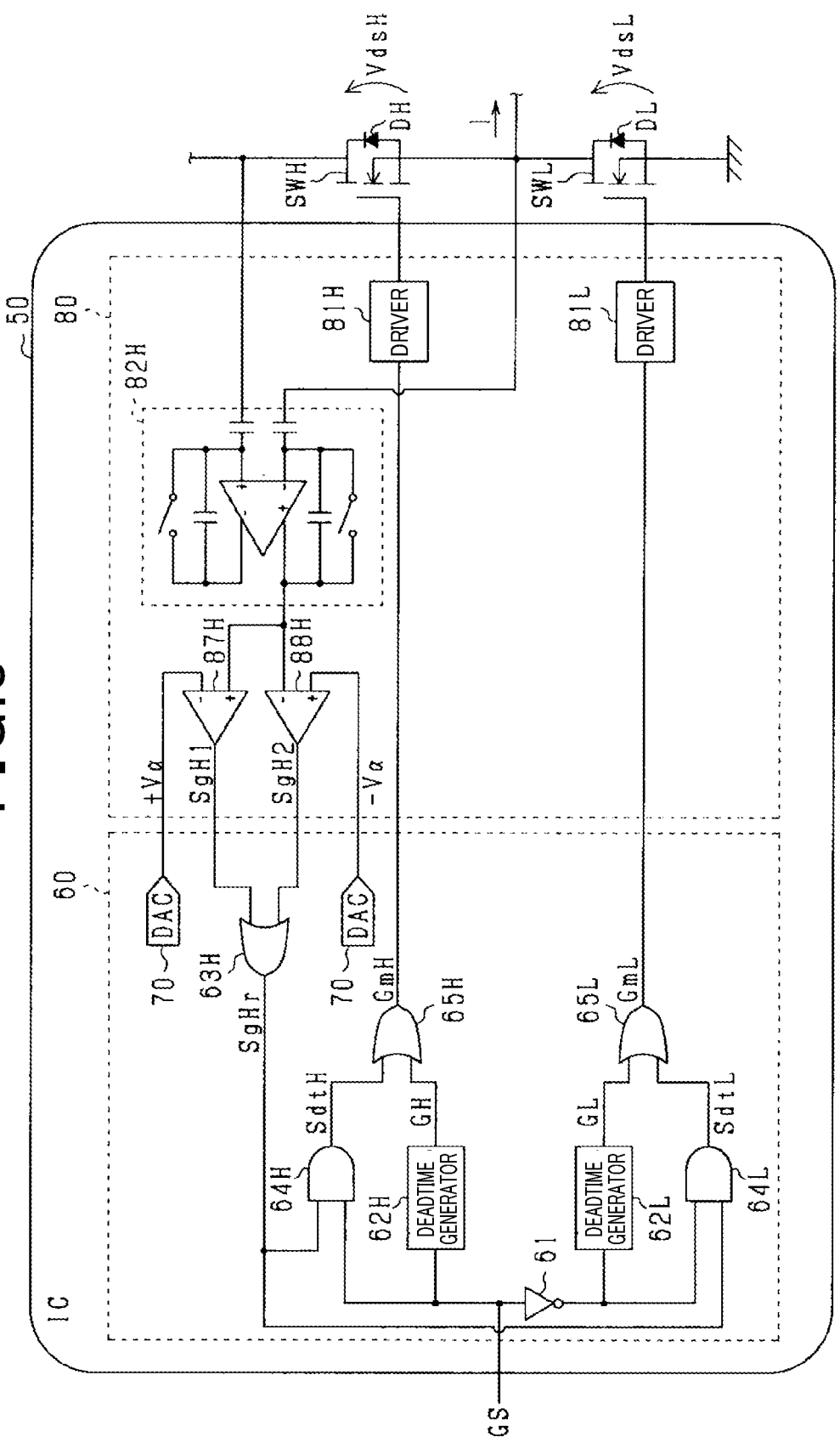
FIG. 8 is a circuit diagram of each drive IC according to the second modification of the first embodiment.

Referring to FIG. 8, each drive IC 50 according to a second modification of the first embodiment is configured not to include the lower-arm detector 82L, the first lower-arm comparator 87L, the second lower-arm comparator 88L, and the first lower-arm OR circuit 63L.

Each of the remaining elements of each drive IC 50 illustrated in FIG. 8 has the same configuration as the corresponding one of the elements illustrated in FIG. 2. For this reason, reference characters assigned to the respective elements illustrated in FIG. 2 are also assigned to the corresponding respective remaining elements illustrated in FIG. 8.

Each drive IC 50 according to the second modification of the first embodiment is configured such that the output signal SgHr of the first upper-arm OR circuit 63H is inputted to the lower-arm AND circuit 64L in place of the output signal SgLr of the first lower-arm OR circuit 63L.

Each drive IC 50 of the second modification of the first embodiment makes it possible to reduce the number of elements in the corresponding drive IC 50 while reducing the actual deadtimes between the upper- and lower-arm switches SWH and SWL.

Second Embodiment

Figure 9:
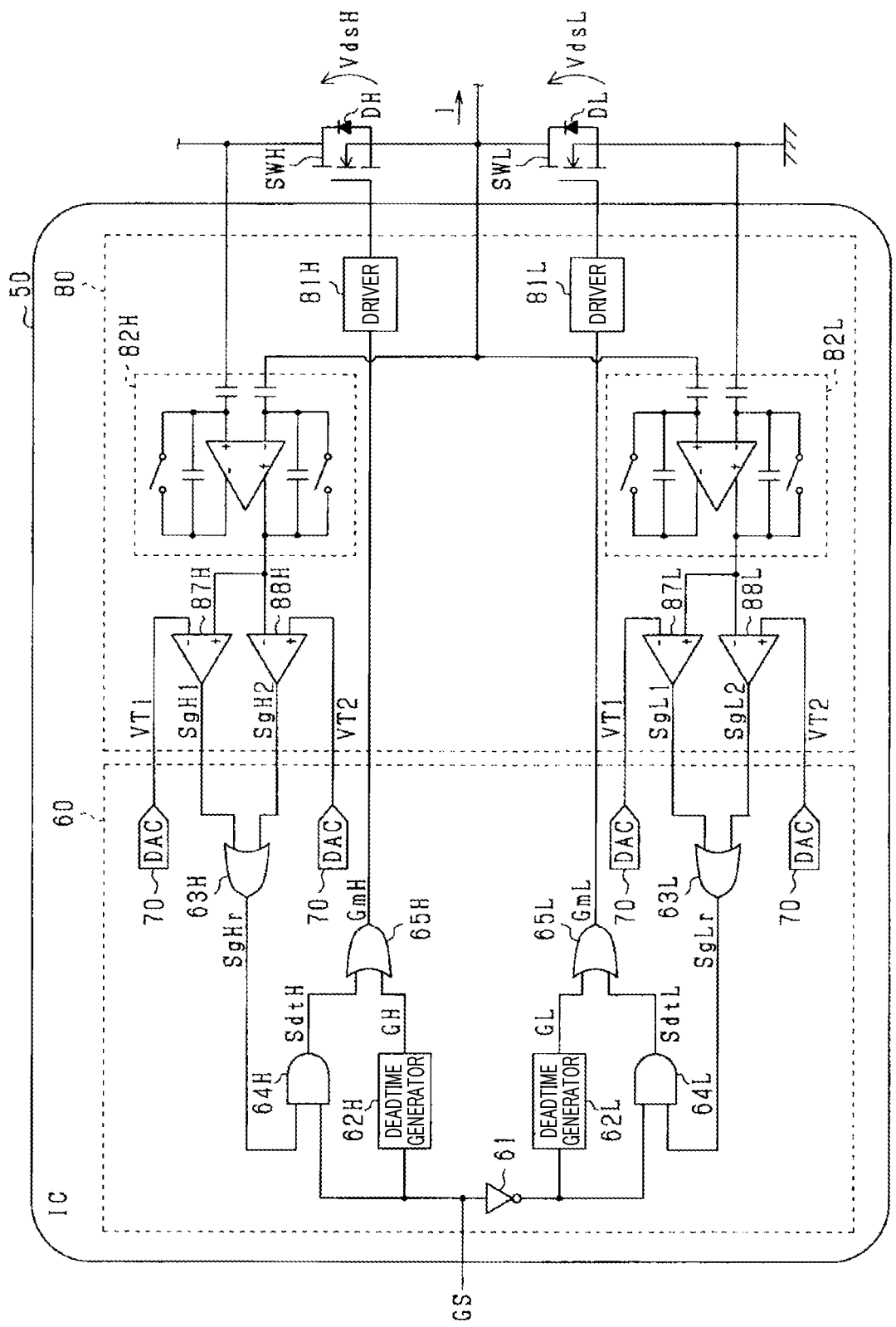
FIG. 9 is a circuit diagram of each drive IC according to the second embodiment of the present disclosure.

The following describes the second embodiment of the present disclosure while focusing on different points of the second embodiment from the first embodiment with reference to FIGS. 9 and 10.

Specifically, the threshold setter 70 according to the second embodiment is configured to variably set the first and second thresholds for each of the upper- and lower-arm detectors 80H and 80L.

This variable setting of the first and second thresholds of each of the upper- and lower-arm detectors 80H and 80L aims to prepare for a risk where it is difficult to ensure a period of resetting a corresponding one of the upper-arm detector 82H and the lower-arm detector 82L due to, for example, an increase in an electrical angular frequency of the rotary electric machine 10.

FIG. 9 illustrates a configuration of each drive IC 50 according to the second embodiment. Elements of the drive IC 50 illustrated in FIG. 9, each of which has the same configuration as the corresponding one of the elements illustrated in FIG. 2, have reference characters that are the same as the reference characters assigned to the respective elements illustrated in FIG. 2.

The threshold setter 70 is configured to

1. Supply a first threshold VT1 to the inverting input terminal of each of the first upper-arm comparator 87H and the first lower-arm comparator 87L

2. Supply a second threshold VT2 to the non-inverting input terminal of each of the second upper-arm comparator 88H and the second lower-arm comparator 88L

Next, the following describes how the first and second thresholds VT1 and VT2 are set with reference to FIG. 10.

The threshold setter 70 is configured to set the first threshold VT1 to an initial value of the positive threshold Vα of 0.4 V, and set the second threshold VT2 to an initial value of the negative threshold −Vα of −0.4 V.

First, the following describes how the threshold setter 70 variably sets the first and second thresholds VT1 and VT2 for the upper-arm switch SWH.

As illustrated in step (a) of FIG. 10, the threshold setter 70 determines whether execution of resetting the upper-arm detector 82H is enabled within a first period; the first period represents a period during which the drain-source voltage VdsH of the upper-arm switch SWH is maintained at the power-supply voltage VDC (12 V).

Upon determination that execution of resetting the upper-arm detector 82H is not enabled within the first period, the threshold setter 70 changes the first threshold VT1, which is inputted to the inverting input terminal of the first upper-arm comparator 87H, from the positive threshold Vα to the sum of the positive threshold Vα and the power-supply voltage VDC (12 V) before the logical high level of the lower-arm drive signal GL is inverted to the logical low level in step (a) of FIG. 10. That is, the value of the first threshold VT1 is changed from the positive threshold Vα to 12.4 V.

In addition, upon determination that execution of resetting the upper-arm detector 82H is not enabled within the first period, the threshold setter 70 changes the second threshold VT2, which is inputted to the non-inverting input terminal of the second upper-arm comparator 88H from the negative threshold −Vα to the sum of the negative threshold −Vα and the power-supply voltage VDC (12 V) before the logical high level of the lower-arm drive signal GL is inverted to the logical low level in step (a) of FIG. 10. That is, the value of the second threshold VT2 is changed from the negative threshold −Vα to 11.6 V.

That is, let us assume that

1. The upper-arm detector 82H has been reset within a second period during which the drain-source voltage VdsH of the upper-arm switch SWH is maintained at 0 V 2. The upper-arm detector 82H thereafter cannot be reset within the first period during which the drain-source voltage VdsH of the upper-arm switch SWH is maintained at the power-supply voltage VDC (12 V)

Even for this assumption, the above changing of each of the first and second thresholds VT1 and VT2 enables the upper-arm switch SWH to be switched from the off state to the on state at, for example, the timing illustrated in FIG. 5.

As illustrated in step (b) of FIG. 10, the threshold setter 70 determines whether execution of resetting the upper-arm detector 82H is enabled within the second period; the second period represents a period during which the drain-source voltage VdsH of the upper-arm switch SWH is maintained at 0 V.

Upon determination that execution of resetting the upper-arm detector 82H is not enabled within the second period, the threshold setter 70 changes the first threshold VT1, which is inputted to the inverting input terminal of the first upper-arm comparator 87H, from the positive threshold Vα to the subtraction of the power-supply voltage VDC (12 V) from the positive threshold Vα, which equals to −11.6 V, before the logical high level of the upper-arm drive signal GH is inverted to the logical low level in step (b) of FIG. 10. That is, the value of the first threshold VT1 is changed from the positive threshold Vα to −11.6 V.

In addition, upon determination that execution of resetting the upper-arm detector 82H is not enabled within the second period, the threshold setter 70 changes the second threshold VT2, which is inputted to the non-inverting input terminal of the second upper-arm comparator 88H from the negative threshold −Vα to the subtraction of the power-supply voltage VDC (12 V) from the negative threshold −Vα, which equals to −12.4 V, before the logical high level of the upper-arm drive signal GH is inverted to the logical low level in step (a) of FIG. 10. That is, the value of the second threshold VT2 is changed from the negative threshold −Vα to −12.4 V.

Next, the following describes how the threshold setter 70 variably sets the first and second thresholds VT1 and VT2 for the lower-arm switch SWL.

As illustrated in step (a) of FIG. 10, the threshold setter 70 determines whether execution of resetting the lower-arm detector 82L is enabled within a third period; the third period represents a period during which the drain-source voltage VdsL of the lower-arm switch SWL is maintained at the power-supply voltage VDC (12 V).

Upon determination that execution of resetting the lower-arm detector 82L is not enabled within the third period, the threshold setter 70 changes the first threshold VT1, which is inputted to the inverting input terminal of the first lower-arm comparator 87L, from the positive threshold Vα to the sum of the positive threshold Vα and the power-supply voltage VDC (12 V) before the logical high level of the upper-arm drive signal GH is inverted to the logical low level in step (a) of FIG. 10. That is, the value of the first threshold VT1 is changed from the positive threshold Vα to 12.4 V.

In addition, upon determination that execution of resetting the lower-arm detector 82L is not enabled within the third period, the threshold setter 70 changes the second threshold VT2, which is inputted to the non-inverting input terminal of the second lower-arm comparator 88L from the negative threshold −Vα to the sum of the negative threshold −Vα and the power-supply voltage VDC (12 V) before the logical high level of the upper-arm drive signal GH is inverted to the logical low level in step (a) of FIG. 10. That is, the value of the second threshold VT2 is changed from the negative threshold −Vα to 11.6 V.

As illustrated in step (b) of FIG. 10, the threshold setter 70 determines whether execution of resetting the lower-arm detector 82L is enabled within a fourth period; the fourth period represents a period during which the drain-source voltage VdsL of the lower-arm switch SWL is maintained at 0 V.

Upon determination that execution of resetting the lower-arm detector 82L is not enabled within the fourth period, the threshold setter 70 changes the first threshold VT1, which is inputted to the inverting input terminal of the first lower-arm comparator 87L, from the positive threshold Vα to the subtraction of the power-supply voltage VDC (12 V) from the positive threshold Vα, which equals to −11.6 V, before the logical high level of the lower-arm drive signal GL is inverted to the logical low level in step (b) of FIG. 10. That is, the value of the first threshold VT1 is changed from the positive threshold Vα to −11.6 V.

In addition, upon determination that execution of resetting the lower-arm detector 82L is not enabled within the fourth period, the threshold setter 70 changes the second threshold VT2, which is inputted to the non-inverting input terminal of the second lower-arm comparator 88L from the negative threshold −Vα to the subtraction of the power-supply voltage VDC (12 V) from the negative threshold −Vα, which equals to −12.4 V, before the logical high level of the lower-arm drive signal GL is inverted to the logical low level in step (b) of FIG. 10. That is, the value of the second threshold VT2 is changed from the negative threshold −Vα to −12.4 V.

After change of each of the first and second thresholds VT1 and VT2, the threshold setter 70 is configured to change the changed value of each of the first and second thresholds VT1 and VT2 to a corresponding one of the initial values in response to execution of the resetting each of the upper- and lower-arm detectors 82H and 82L.

The threshold setter 70 can be configured to determine, based on the drive signal GS, whether a time that has elapsed since a current execution of the resetting until cancellation of the resetting at the current execution is smaller than a predetermined threshold time to thereby determine whether a next execution of the resetting the lower-arm detector 82L is enabled.

Each drive IC 50 according to the second embodiment makes it possible to, even if there is a situation where it is difficult to reset each of the upper-arm detector 82H and the lower-arm detector 82L, prevent erroneous detection of turning-off of each of the upper- and lower-arm switches SWH and SWL.

Third Embodiment

The following describes the third embodiment of the present disclosure while focusing on different points of the third embodiment from the first embodiment with reference to FIGS. 11 to 17.

Specifically, the third embodiment has a function of measuring a turn-on time and a turn-off time of each of the upper- and lower-arm switches SWH and SWL, and correcting, based on the measured turn-on time and turn-off time of each of the upper- and lower-arm switches SWH and SWL, the deadtime for the upper- and lower-arm switches SWH and SWL.

Figure 11:
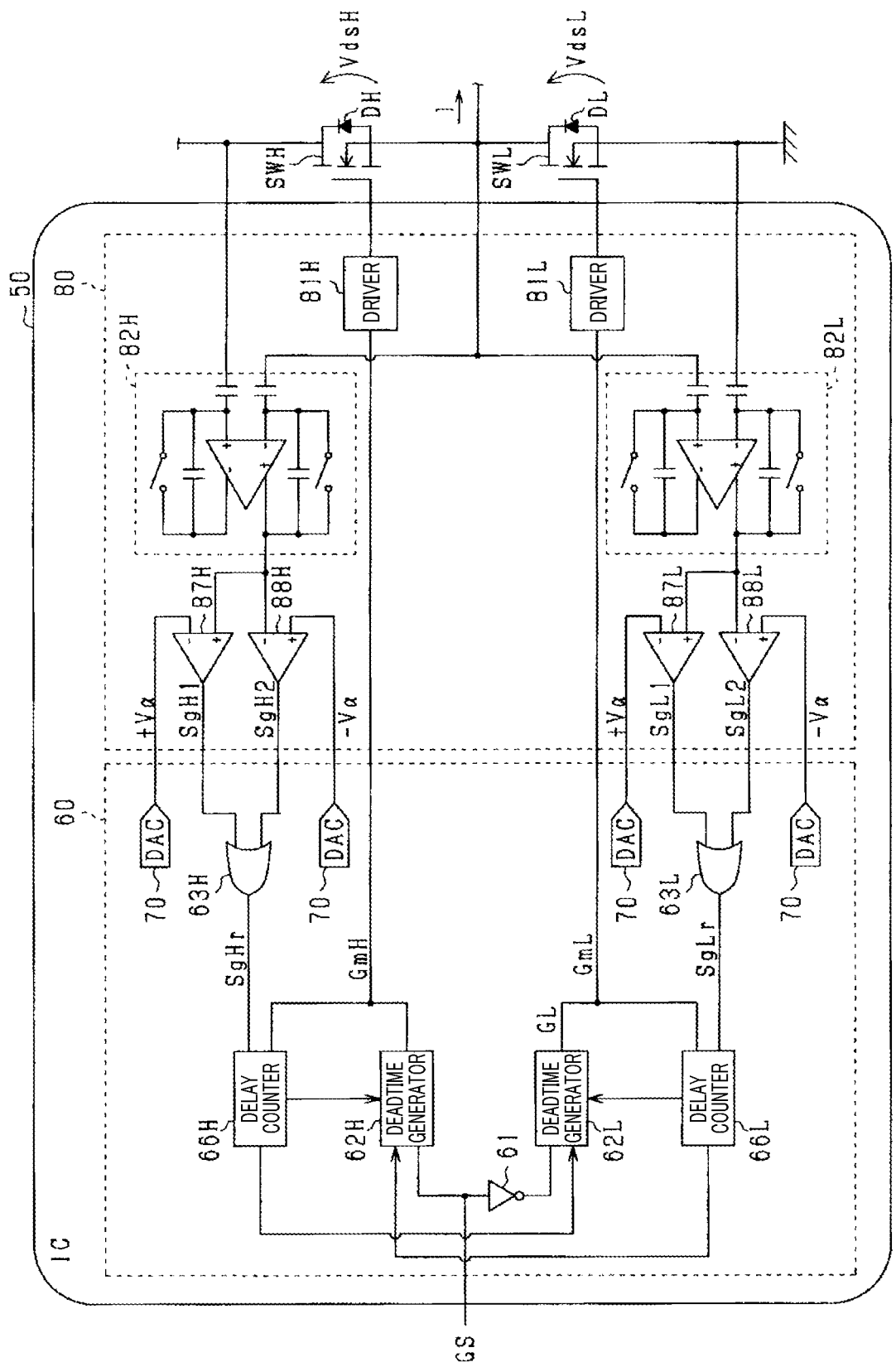
FIG. 11 is a circuit diagram of each drive IC according to the third embodiment of the present disclosure.

For implementing the function, as illustrated in FIG. 11, the configuration of the drive IC 50 according to the third embodiment has been changed from that of the drive IC 50 according to the first embodiment.

Each of unchanged elements of the drive IC 50 illustrated in FIG. 11 has the same configuration as the corresponding one of the elements illustrated in FIG. 2. For this reason, reference characters assigned to the respective elements illustrated in FIG. 2 are also assigned to the corresponding respective unchanged elements illustrated in FIG. 11.

The third embodiment refers to the first upper-arm OR circuit 63H as an upper-arm OR circuit 63H, and to the first lower-arm OR circuit 63L as a lower-arm OR circuit 63L.

The changed drive IC 50 includes a logic unit 60 changed to include an upper-arm delay counter 66H and a lower-arm delay counter 66L; the upper- and lower-arm delay counters 66H and 66L serve as a measuring unit.

The upper-arm delay counter 66H is configured to measure, i.e., count, a latest turn-on time THon of the upper-arm switch SWH. The latest turn-on time THon is defined as a period between a latest logical inversion of the upper-arm gate signal GmH, which is outputted from the upper-arm deadtime generator 62H, from the logical low level and a latest logical inversion of the output signal SgHr, which is outputted from the upper-arm OR circuit 63H, from the logical low level to the logical high level.

The latest turn-on time THon is, as illustrated in FIGS. 12A to 12D, equivalent to a period between the latest logical inversion of the upper-arm gate signal GmH from the logical low level to the logical high level and the latest turn-on of the upper-arm switch SWH.

Figure 12A:
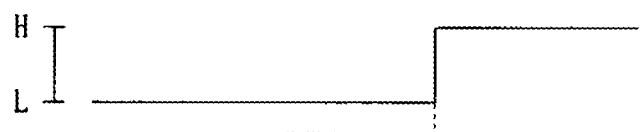
FIGS. 12A to 12D are a joint timing chart schematically illustrating a first pattern of how gate signals and switches are each changed over time.
Figure 12B:
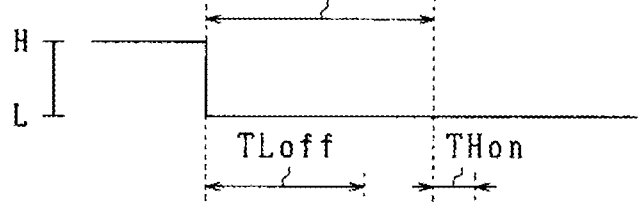
Figure 12C:
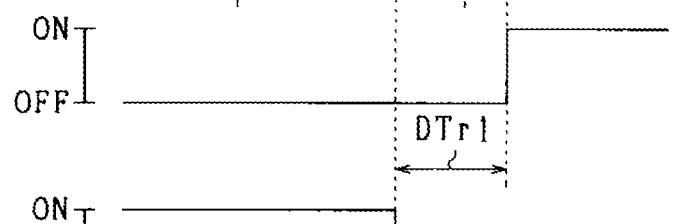
Figure 12D:
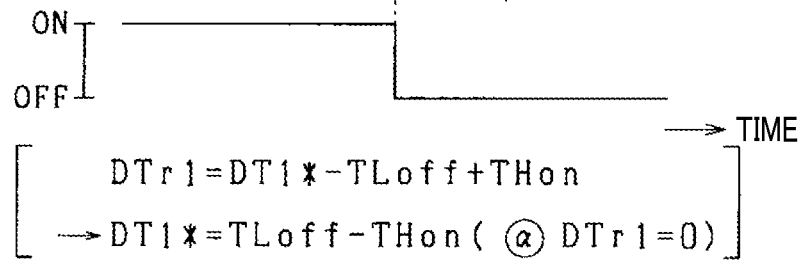
Figure 13A:
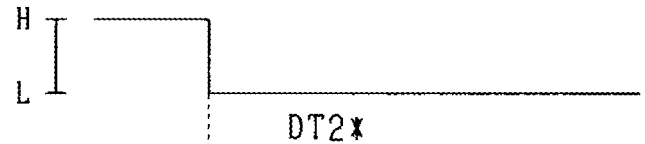
FIGS. 13A to 13D are a joint timing chart schematically illustrating a second pattern of how the gate signals and switches are each changed over time.
Figure 13B:
Figure 13C:
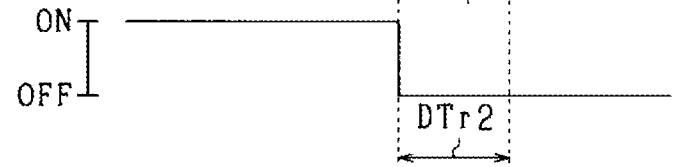
Figure 13D:
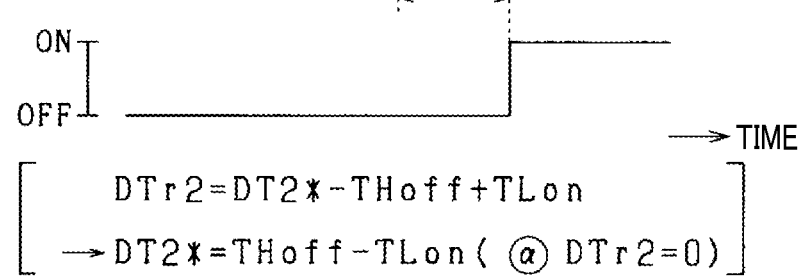

FIG. 12A represents how the upper-arm gate signal GmH is changed over time, and FIG. 12B represents how the lower-arm gate signal GmL is changed over time. FIG. 12C represents how the on/off state of the upper-arm switch SWH is changed over time, and FIG. 12D represents how the on/or state of the lower-arm switch SWL is changed over time.

The upper-arm delay counter 66H is also configured to measure, i.e., count, a latest turn-off time THoff of the upper-arm switch SWH; the latest turn-off time THoff is defined as a period between a latest logical inversion of the upper-arm gate signal GmH from the logical high level to the logical low level and a latest logical inversion of the output signal SgHr from the logical high level to the logical low level. The latest turn-off time THoff is set to be longer than the latest turn-on time THon.

The latest turn-off time THoff is, as illustrated in FIGS. 13A to 13D, is equivalent to a period between the latest logical inversion of the upper-arm gate signal GmH from the logical high level to the logical low level and a latest turn-off of the upper-arm switch SWH. FIGS. 13A to 13D respectively correspond to FIGS. 12A to 12D.

The lower-arm delay counter 66L is configured to measure, i.e., count, a latest turn-on time TLon of the lower-arm switch SWL. The latest turn-on time TLon is defined as a period between a latest logical inversion of the lower-arm gate signal GmL, which is outputted from the lower-arm deadtime generator 62L, from the logical low level to the logical high level and a latest logical inversion of the output signal SgLr, which is outputted from the lower-arm OR circuit 63L, from the logical low level to the logical high level.

The latest turn-on time TLon is, as illustrated in FIGS. 13A to 13D, is equivalent to a period between the latest logical inversion of the lower-arm gate signal GmL from the logical low level to the logical high level and a latest turn-on of the lower-arm switch SWL.

The lower-arm delay counter 66L is also configured to measure, i.e., count, a latest turn-off time TLoff of the lower-arm switch SWL; the latest turn-off time TLoff is defined as a period between a latest logical inversion of the lower-arm gate signal GmL from the logical high level to the logical low level and a latest logical inversion of the output signal SgLr from the logical high level to the logical low level. The latest turn-off time TLoff is set to be longer than the latest turn-on time TLon.

The latest turn-off time TLoff is, as illustrated in FIGS. 12A to 12D, is equivalent to a period between the latest logical inversion of the lower-arm gate signal GmL from the logical high level to the logical low level and a latest turn-off of the lower-arm switch SWL.

The upper-arm deadtime generator 62H is configured to subtract the latest turn-on time THon from the latest turn-off time THoff to thereby calculate a first command deadtime DT1* for a next logical inversion of the upper-arm gate signal GmH from the logical low level to the logical high level. As illustrated in FIGS. 12A to 12D, how to calculate the first command deadtime DT1* can be derived from a condition where an actual deadtime DTr1 between the latest turn-off of the lower-arm switch SWL to the latest turn-on of the upper-arm switch SWH is regarded as zero.

The upper-arm deadtime generator 62H is configured to delay, by the calculated first command deadtime DT1*, a next logical inversion of the upper-arm drive signal GH from the logical low level to the logical high level, thus generating the upper-arm gate signal GmH whose next logical inversion from the logical low level to the logical high level is delayed from the next logical inversion of the upper-arm drive signal GH from the logical low level to the logical high level. Then, the upper-arm deadtime generator 62H is configured to output the upper-arm gate signal GmH to each of the upper-arm driver 81H and the upper-arm delay counter 66H.

The lower-arm deadtime generator 62L is configured to subtract the latest turn-off time THoff from the latest turn-on time TLon to thereby calculate a second command deadtime DT2* for a next logical inversion of the lower-arm gate signal GmL from the logical low level to the logical high level. As illustrated in FIGS. 13A to 13D, how to calculate the second command deadtime DT2* can be derived from a condition where an actual deadtime DTr2 between the latest turn-off of the upper-arm switch SWH to the latest turn-on of the lower-arm switch SWL is regarded as zero.

The lower-arm deadtime generator 62L is configured to delay, by the calculated second command deadtime DT2*, a next logical inversion of the lower-arm drive signal GL from the logical low level to the logical high level, thus generating the lower-arm gate signal GmL whose next logical inversion from the logical low level to the logical high level is delayed from the next logical inversion of the lower-arm drive signal GL from the logical low level to the logical high level. Then, the lower-arm deadtime generator 62L is configured to output the lower-arm gate signal GmL to each of the lower-arm driver 81L and the lower-arm delay counter 66L.

Each of the deadtime generators 62H and 62L serves as a corrector.

Next, the following describes how the turn-on and turn-off times THon and THoff for the upper-arm switch SWH are measured and how the turn-on and turn-off times TLon and TLoff for the lower-arm switch SWL are measured.

First, the following describes how the turn-on and turn-off times THon, THoff, TLon, and TLoff are measured while the polarity of the current I flowing between the three-phase windings 11 and the connection point between the upper- and lower-arm switches SWH and SWL is positive using FIGS. 14A to 14K and 14M.

FIG. 14A represents how each of the drain-source voltage VdsH of the upper-arm switch SWH and the upper-arm drive signal GH is changed over time.

FIGS. 14B to 14E respectively correspond to FIGS. 5B to 5E.

FIG. 14F represents how the upper-arm delay counter 66H operates over time, and FIG. 14M represents how the lower-arm delay counter 66L operates over time.

FIGS. 14H to 14K respectively correspond to FIGS. 5H to 5K.

Referring to FIGS. 14A to 14K and 14M, before time t1, the upper-arm gate signal GmH is in the logical low level, and the lower-arm gate signal GmL is in the logical high level. Before the time t1, the upper-arm switch SWH is in the off state, and the lower-arm switch SWL is in the on state. This results in the drain-source voltage VdsH of the upper-arm switch SWH being the power-supply voltage VDC of 12 V, and the drain-source voltage VdsL of the lower-arm switch SWL being 0 V.

At the time t1, resetting of the lower-arm detector 82L is carried out. This resetting causes the logical high level of the output signal SgL1 of the first lower-arm comparator 87L to be inverted to the logical low level, resulting in the logical high level of the output signal SgLr of the lower-arm OR circuit 63L being inverted to the logical low level.

At time t2, the resetting of the lower-arm detector 82L is cancelled. This cancelling causes the lower-arm detector 82L to output a voltage change from the reference voltage of 0 V, which is a value of the drain-source voltage VdsL of the lower-arm switch SWL at the time t2

At time t3, the logical high level of the lower-arm gate signal GmL is inverted to the logical low level, so that the lower-arm switch SWL is switched from the on state to the off state. This causes a current to flow through the lower-arm diode DL, resulting in the drain-source voltage VdsL across the lower-arm switch SWL starting to fall down from 0 V to −0.7 V. This results in the drain-source voltage VdsL becoming lower than the negative threshold Vα of −0.4 V at time t4.

This causes the logical low level of the output signal SgL2 of the second lower-arm comparator 88L to be inverted to the logical high level, resulting in the logical low level of the output signal SgLr of the lower-arm OR circuit 63L being inverted to the logical high level. The lower-arm counter 66L measures a period from the time t3 to the time t4 as the latest turn-off period TLoff of the lower-arm switch SWL.

Thereafter, resetting of the upper-arm detector 82H is carried out at time t5. This resetting causes the logical high level of the output signal SgH1 of the first upper-arm comparator 87H to be inverted to the logical low level, resulting in the logical high level of the output signal SgHr of the upper-arm OR circuit 63H being inverted to the logical low level.

At time t6, the resetting of the upper-arm detector 82H is cancelled. This cancelling causes the upper-arm detector 82H to output a voltage change from the reference voltage of 12 V, which is a value of the drain-source voltage VdsH of the upper-arm switch SWH.

At time t7, the logical low level of the upper-arm gate signal GmH is inverted to the logical high level, so that the upper-arm switch SWH is switched from the off state to the on state. This causes the output voltage of the upper-arm detector 82H to start to fall down from 0 V to −12.7 V, resulting in the output voltage of the upper-arm detector 82H becoming lower than the negative threshold −Vα of −0.7 V at time t8. This causes the logical low level of the output signal SgH2 of the second upper-arm comparator 88H to be inverted to the logical high level, resulting in the logical low level of the output signal SgHr of the upper-arm OR circuit 63H being inverted to the logical high level. The upper-arm counter 66H measures a period from the time t7 to the time t8 as the latest turn-on period THon of the upper-arm switch SWH.

At time t9, resetting of the upper-arm detector 82H is carried out. This resetting causes the logical high level of the output signal SgH2 of the second upper-arm comparator 88H to be inverted to the logical low level, resulting in the logical high level of the output signal SgHr of the upper-arm OR circuit 63H being inverted to the logical low level.

At time t10, the resetting of the upper-arm detector 82H is cancelled. This cancelling causes the upper-arm detector 82H to output a voltage change from the reference voltage of 0 V, which is a value of the drain-source voltage VdsH of the upper-arm switch SWH at the time t10.

At time t11, the logical high level of the upper-arm gate signal GmH is inverted to the logical low level, so that the upper-arm switch SWH is switched from the on state to the off state. This causes the output voltage of the upper-arm detector 82H to start to rise from 0 V, resulting in the output voltage of the upper-arm detector 82H becoming higher than the positive threshold Vα of 0.4 V at time t12. This causes the logical low level of the output signal SgH1 of the first upper-arm comparator 87H to be inverted to the logical high level, resulting in the logical low level of the output signal SgHr of the upper-arm OR circuit 63H being inverted to the logical high level. The upper-arm counter 66H measures a period from the time t11 to the time t12 as the latest turn-off period THoff of the upper-arm switch SWH.

At time t13, resetting of the lower-arm detector 82L is carried out. This resetting causes the logical high level of the output signal SgL1 of the first lower-arm comparator 87L to be inverted to the logical low level, resulting in the logical high level of the output signal SgLr of the lower-arm OR circuit 63L being inverted to the logical low level.

At time t14, the resetting of the lower-arm detector 82L is cancelled. This cancelling causes the lower-arm detector 82L to output a voltage change from the reference voltage of −0.7 V, which is a value of the drain-source voltage VdsL of the lower-arm switch SWL at the time t14.

At time t15, the logical low level of the lower-arm gate signal GmL is inverted to the logical high level, so that the lower-arm switch SWL is switched from the off state to the on state. This causes the output voltage of the lower-arm detector 82L to start to rise from 0 V toward 0.7 V, resulting in the output voltage of the lower-arm detector 82L becoming higher than the positive threshold Vα of 0.4 V at time t16. This causes the logical low level of the output signal SgL1 of the first lower-arm comparator 87L to be inverted to the logical high level, resulting in the logical low level of the output signal SgLr of the lower-arm OR circuit 63L being inverted to the logical high level. The lower-arm counter 66L measures a period from the time t15 to the time t16 as the latest turn-on period TLon of the lower-arm switch SWL.

Next, the following describes how the turn-on and turn-off times THon, THoff, TLon, and TLoff are measured while the polarity of the current I flowing between the three-phase windings 11 and the connection point between the upper- and lower-arm switches SWH and SWL is negative using FIGS. 15A to 15K and 15M. FIGS. 15A to 15K and 15M respectively correspond to FIGS. 14A to 14K and 14M.

Referring to FIGS. 15A to 15K and 15M, before time t1, the upper-arm gate signal GmH is in the logical low level, and the lower-arm gate signal GmL is in the logical high level. Before the time t1, the upper-arm switch SWH is in the off state, and the lower-arm switch SWL is in the on state. This results in the drain-source voltage VdsH of the upper-arm switch SWH being the power-supply voltage VDC of 12 V, and the drain-source voltage VdsL of the lower-arm switch SWL being 0 V.

At the time t1, resetting of the lower-arm detector 82L is carried out. This resetting causes the logical high level of the output signal SgL2 of the second lower-arm comparator 88L to be inverted to the logical low level, resulting in the logical high level of the output signal SgLr of the lower-arm OR circuit 63L being inverted to the logical low level.

At time t2, the resetting of the lower-arm detector 82L is cancelled. This cancelling causes the lower-arm detector 82L to output a voltage change from the reference voltage of 0 V, which is a value of the drain-source voltage VdsL of the lower-arm switch SWL at the time t2

At time t3, the logical high level of the lower-arm gate signal GmL is inverted to the logical low level, so that the lower-arm switch SWL is switched from the on state to the off state. This causes a current to flow through the upper-arm diode DH, resulting in the output voltage of the lower-arm detector 82L starting to rise from 0V, resulting in the output voltage of the lower-arm detector 82L becoming higher than the positive threshold Vα of 0.4 V at time t4.

This causes the logical low level of the output signal SgL1 of the first lower-arm comparator 87L to be inverted to the logical high level, resulting in the logical low level of the output signal SgLr of the lower-arm OR circuit 63L being inverted to the logical high level. The lower-arm counter 66L measures a period from the time t3 to the time t4 as the latest turn-off period TLoff of the lower-arm switch SWL.

Thereafter, resetting of the upper-arm detector 82H is carried out at time t5. This resetting causes the logical high level of the output signal SgH1 of the first upper-arm comparator 87H to be inverted to the logical low level, resulting in the logical high level of the output signal SgHr of the upper-arm OR circuit 63H being inverted to the logical low level.

At time t6, the resetting of the upper-arm detector 82H is cancelled. This cancelling causes the upper-arm detector 82H to output a voltage change from the reference voltage of −0.7 V, which is a value of the drain-source voltage VdsH of the upper-arm switch SWH at the time t6.

At time t7, the logical low level of the upper-arm gate signal GmH is inverted to the logical high level, so that the upper-arm switch SWH is switched from the off state to the on state. This causes the output voltage of the upper-arm detector 82H to start to rise from −0.7 V toward 0 V, resulting in the output voltage of the upper-arm detector 82H becoming higher than the positive threshold Vα of 0.4 V at time t8. This causes the logical low level of the output signal SgH1 of the first upper-arm comparator 87H to be inverted to the logical high level, resulting in the logical low level of the output signal SgHr of the upper-arm OR circuit 63H being inverted to the logical high level. The upper-arm counter 66H measures a period from the time t7 to the time t8 as the latest turn-on period THon of the upper-arm switch SWH.

At time t9, resetting of the upper-arm detector 82H is carried out. This resetting causes the logical high level of the output signal SgH1 of the first upper-arm comparator 87H to be inverted to the logical low level, resulting in the logical high level of the output signal SgHr of the upper-arm OR circuit 63H being inverted to the logical low level.

At time t10, the resetting of the upper-arm detector 82H is cancelled. This cancelling causes the upper-arm detector 82H to output a voltage change from the reference voltage of 0 V, which is a value of the drain-source voltage VdsH of the upper-arm switch SWH at the time t10.

At time t11, the logical high level of the upper-arm gate signal GmH is inverted to the logical low level, so that the upper-arm switch SWH is switched from the on state to the off state. This causes the output voltage of the upper-arm detector 82H to start to fall down from 0 V toward −0.7 V, resulting in the output voltage of the upper-arm detector 82H becoming lower than the negative threshold −Vα of −0.4 V at time t12. This causes the logical low level of the output signal SgH2 of the second upper-arm comparator 88H to be inverted to the logical high level, resulting in the logical low level of the output signal SgHr of the upper-arm OR circuit 63H being inverted to the logical high level. The upper-arm counter 66H measures a period from the time t11 to the time t12 as the latest turn-off period THoff of the upper-arm switch SWH.

At time t13, resetting of the lower-arm detector 82L is carried out. This resetting causes the logical high level of the output signal SgL1 of the first lower-arm comparator 87L to be inverted to the logical low level, resulting in the logical high level of the output signal SgLr of the lower-arm OR circuit 63L being inverted to the logical low level.

At time t14, the resetting of the lower-arm detector 82L is cancelled. This cancelling causes the lower-arm detector 82L to output a voltage change from the reference voltage of 12.7 V, which is a value of the drain-source voltage VdsL of the lower-arm switch SWL at the time t14.

At time t15, the logical low level of the lower-arm gate signal GmL is inverted to the logical high level, so that the lower-arm switch SWL is switched from the off state to the on state. This causes the output voltage of the lower-arm detector 82L to start to fall down from 0 V toward −12.7 V, resulting in the output voltage of the lower-arm detector 82L becoming lower than the negative threshold Vα of −0.4 V at time t16. This causes the logical low level of the output signal SgL2 of the second lower-arm comparator 88L to be inverted to the logical high level, resulting in the logical low level of the output signal SgLr of the lower-arm OR circuit 63L being inverted to the logical high level. The lower-arm counter 66L measures a period from the time t15 to the time t16 as the latest turn-on period TLon of the lower-arm switch SWL.

The third embodiment described above achieves the following advantageous benefits.

Specifically, each drive IC 50 according to the third embodiment is configured correct each of the gate signals GmH and GmL to thereby bring an actual operating state of the corresponding one of the upper- and lower-arm switches SWH and SWL to approach a corresponding operating state defined by the corresponding one of the on command and off command. This configuration therefore makes it possible to measure (1) A value of the current I in synchronization with each of the logical inversions of the gate signal GmH with a smaller time lag (2) A value of the current I in synchronization with each of the logical inversions of the gate signal GmL with a smaller time lag First Modification of Third Embodiment The condition where the actual deadtime DTr1 is regarded as zero is not absolutely necessary for calculating the first command deadtime DT1*.

That is, the upper-arm deadtime generator 62H according to a first modification of the third embodiment is configured to calculate the first command deadtime DT1* in accordance with the following equation:

$$DT1* = TLoff - THon + \Delta Tdt$$

where ΔTdt represents an infinitesimally short time period as a margin.

Similarly, the condition where the actual deadtime DTr2 is regarded as zero is not absolutely necessary for calculating the second command deadtime DT2*.

That is, the lower-arm deadtime generator 62L according to the first modification of the third embodiment is configured to calculate the second command deadtime DT2* in accordance with the following equation:

$$DT2* = THoff - TLon + \Delta Tdt$$

Second Modification of Third Embodiment

Figure 16:
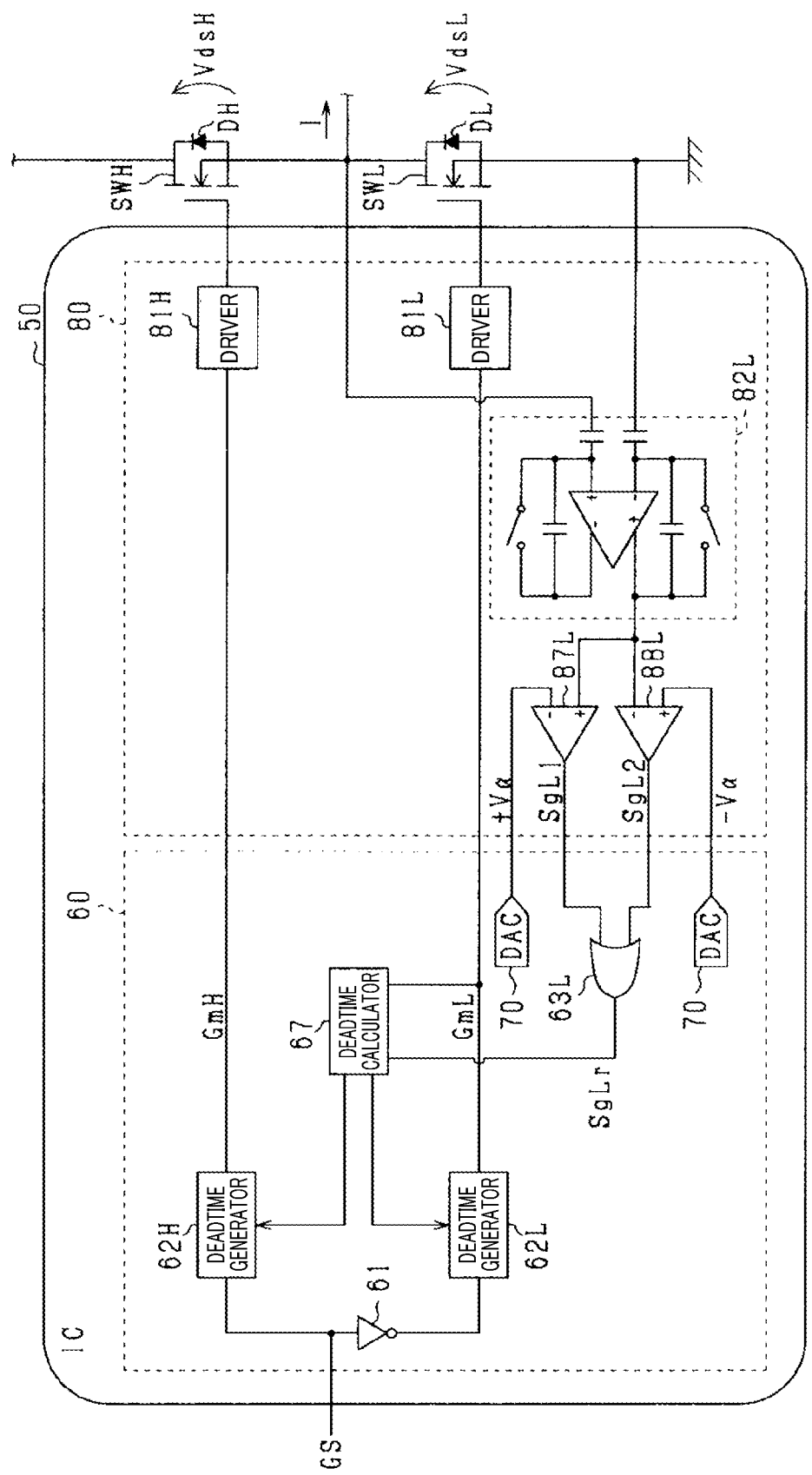
FIG. 16 is a circuit diagram of each drive IC according to the second modification of the third embodiment.

Referring to FIG. 16, each drive IC 50 according to a second modification of the third embodiment is configured not to include the upper-arm detector 82H, the first upper-arm comparator 87H, the second upper-arm comparator 88H, the upper-arm OR circuit 63H, the upper-arm delay counter 66H, and the lower-arm delay counter 66L.

Each of the remaining elements of each drive IC 50 illustrated in FIG. 16 has the same configuration as the corresponding one of the elements illustrated in FIG. 11. For this reason, reference characters assigned to the respective elements illustrated in FIG. 11 are also assigned to the corresponding respective remaining elements illustrated in FIG. 16.

The logic unit 60 of each drive IC 50 according to the second modification of the third embodiment includes a deadtime calculator 67. The deadtime calculator 67 is configured such that the lower-arm gate signal GmL and the output signal SgLr of the lower-arm OR circuit 63L are inputted thereto.

The deadtime calculator 67 is configured to measure, i.e., count, the latest turn-on time TLon of the lower-arm switch SWL; the latest turn-on time TLon is defined as the period between the latest logical inversion of the lower-arm gate signal GmL, which is outputted from the lower-arm deadtime generator 62L, from the logical low level to the logical high level and the latest logical inversion of the output signal SgLr, which is outputted from the lower-arm OR circuit 63L, from the logical low level to the logical high level.

The deadtime calculator 67 is also configured to measure, i.e., count, the latest turn-off time TLoff of the lower-arm switch SWL; the latest turn-off time TLoff is defined as the period between the latest logical inversion of the lower-arm gate signal GmL, which is outputted from the lower-arm deadtime generator 62L, from the logical high level to the logical low level and the latest logical inversion of the output signal SgLr, which is outputted from the lower-arm OR circuit 63L, from the logical low level to the logical high level.

Each of the upper- and lower-arm deadtime generators 62H and 62L is configured to subtract the latest turn-on time TLon from the latest turn-off time TLoff to thereby calculate a command deadtime DT*.

The second modification of the third embodiment is configured such that operation characteristics of the upper-arm switch SWH are equivalent to those of the lower-arm switch SWL. This configuration enables the command deadtime DT* to be shared commonly by the upper- and lower-arm deadtime generators 62H and 62L.

Specifically, the upper-arm deadtime generator 62H is configured to delay, by the command deadtime DT*, a next logical inversion of the upper-arm drive signal GH from the logical low level to the logical high level, thus generating the upper-arm gate signal GmH. Similarly, the lower-arm deadtime generator 62L is configured to delay, by the command deadtime DT*, a next logical inversion of an output signal from the inverter 61 from the logical low level to the logical high level, thus generating the lower-arm gate signal GmL.

The second modification of the third embodiment achieves advantageous benefits, which are substantially identical to those achieved by the third embodiment, while resulting in a smaller number of components of each drive IC 50.

Third Modification of Third Embodiment

Figure 17:
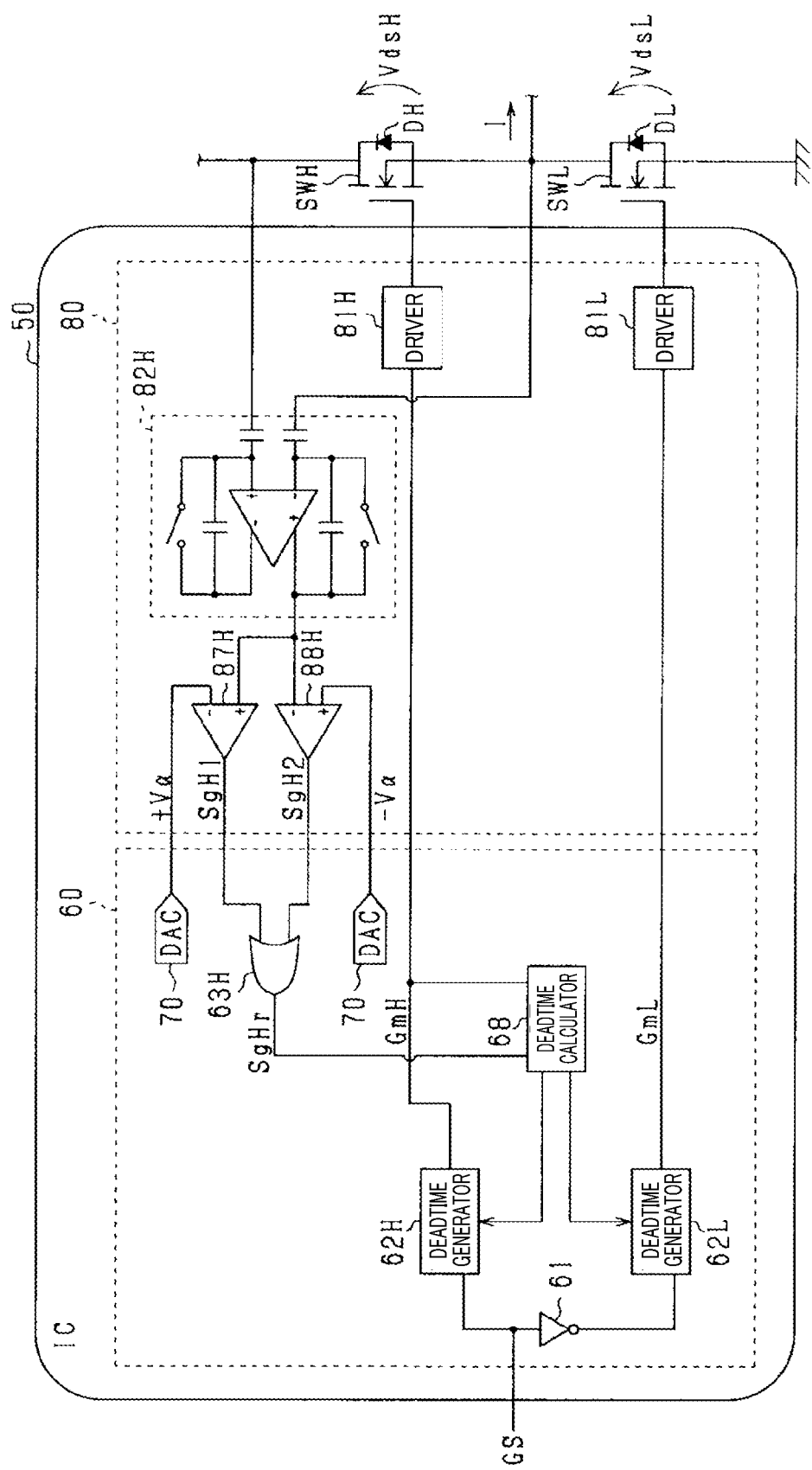
FIG. 17 is a circuit diagram of each drive IC according to the third modification of the third embodiment.

Referring to FIG. 17, each drive IC 50 according to a third modification of the third embodiment is configured not to include the lower-arm detector 82L, the first lower-arm comparator 87L, the second lower-arm comparator 88L, the lower-arm OR circuit 63L, the upper-arm delay counter 66H, and the lower-arm delay counter 66L.

Each of the remaining elements of each drive IC 50 illustrated in FIG. 17 has the same configuration as the corresponding one of the elements illustrated in FIG. 11. For this reason, reference characters assigned to the respective elements illustrated in FIG. 11 are also assigned to the corresponding respective remaining elements illustrated in FIG. 17.

The logic unit 60 of each drive IC 50 according to the third modification of the third embodiment includes the deadtime calculator 67 described in the second modification of the third embodiment.

The deadtime calculator 67 is configured such that the upper-arm gate signal GmH and the output signal SgHr of the upper-arm OR circuit 63H are inputted thereto.

The deadtime calculator 67 is configured to measure, i.e., count, the latest turn-on time THon of the upper-arm switch SWH; the latest turn-on time THon is defined as the period between the latest logical inversion of the upper-arm gate signal GmH, which is outputted from the upper-arm deadtime generator 62H, from the logical low level to the logical high level and the latest logical inversion of the output signal SgHr, which is outputted from the upper-arm OR circuit 63H, from the logical low level to the logical high level.

The deadtime calculator 67 is also configured to measure, i.e., count, the latest turn-off time THoff of the upper-arm switch SWH; the latest turn-off time THoff is defined as the period between the latest logical inversion of the upper-arm gate signal GmH, which is outputted from the upper-arm deadtime generator 62H, from the logical high level to the logical low level and the latest logical inversion of the output signal SgHr, which is outputted from the upper-arm OR circuit 63H, from the logical low level to the logical high level.

The third modification of the third embodiment is configured such that operation characteristics of the upper-arm switch SWH are equivalent to those of the lower-arm switch SWL. This configuration enables the command deadtime DT* to be shared commonly by the upper- and lower-arm deadtime generators 62H and 62L.

The third modification of the third embodiment achieves advantageous benefits, which are substantially identical to those achieved by the third embodiment, while resulting in a smaller number of components of each drive IC 50.

Fourth Embodiment

Figure 18:
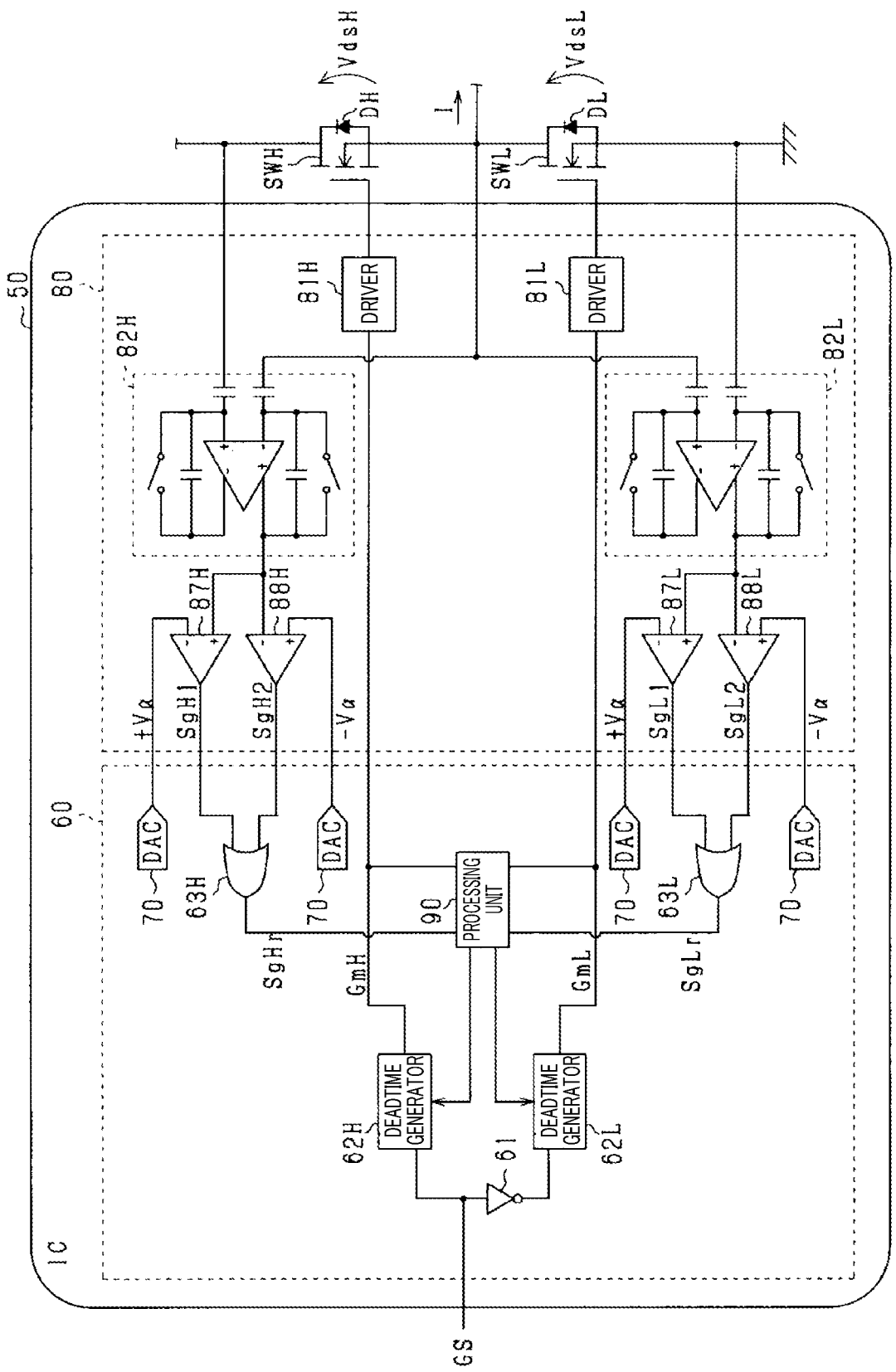
FIG. 18 is a circuit diagram of each drive IC according to the fourth embodiment of the present disclosure.

The following describes the fourth embodiment of the present disclosure while focusing on different points of the fourth embodiment from the third embodiment with reference to FIGS. 18 to 20.

The configuration of the drive IC 50 according to the fourth embodiment has been changed from that of the drive IC 50 according to the third embodiment (see FIG. 18).

Each of unchanged elements of the drive IC 50 illustrated in FIG. 18 has the same configuration as the corresponding one of the elements illustrated in FIG. 11. For this reason, reference characters assigned to the respective elements illustrated in FIG. 11 are also assigned to the corresponding respective unchanged elements illustrated in FIG. 18.

The logic unit 60 of the drive IC 50 includes a processing unit 90. The processing unit 90 is configured such that the upper-arm gate signal GmH outputted from the upper-arm deadtime generator 63H, the lower-arm gate signal GmL outputted from the lower-arm deadtime generator 63L, the output signal SgHr of the upper-arm OR circuit 63H, and the output signal SgLr of the lower-arm OR circuit 63L are inputted thereto.

Figure 19A:
FIGS. 19A to 19E are a joint timing chart schematically illustrating a first pattern of how gate signals and switches are each changed over time.
Figure 19B:
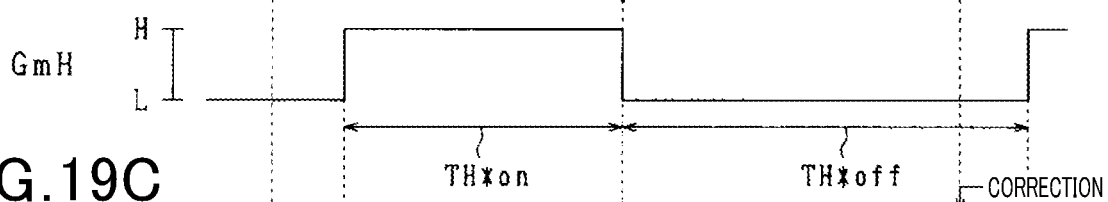
Figure 19C:
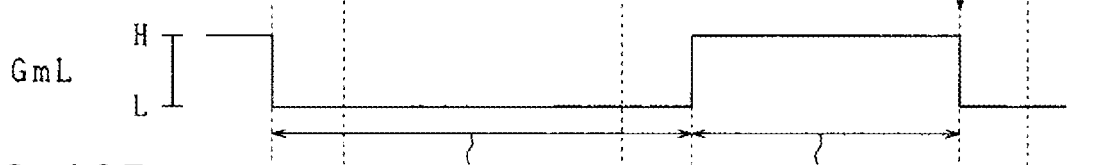

As illustrated in FIGS. 19A to 19E, the processing unit 90 is configured to alternately 1. Measure, as an upper-arm on command period TH*on, a period during which the logical level of the upper-arm gate signal GmH is in the logical high level 2. Measure, as an upper-arm off command period TH*off, a period during which the logical level of the upper-arm gate signal GmH is in the logical low level FIG. 19A represents how the drive signal GS is changed over time, and FIGS. 19B to 19E respectively correspond to FIGS. 12A to 12E.

Figure 19D:
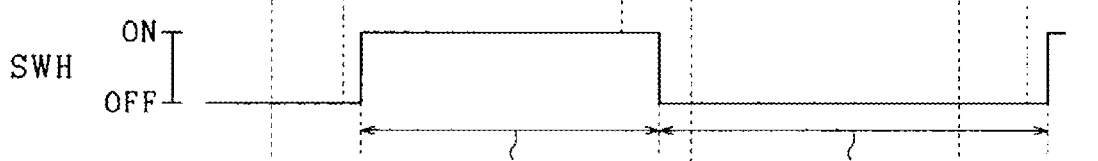

Additionally, as illustrated in FIGS. 19A to 19E, the processing unit 90 is configured to alternately 1. Measure, as a lower-arm on command period TL*on, a period during which the logical level of the lower-arm gate signal GmL is in the logical high level 2. Measure, as a lower-arm off command period TL*off, a period during which the logical level of the lower-arm gate signal GmL is in the logical low level In particular, the processing unit 90 is configured to, as illustrated in FIG. 19D, measure, as an upper-arm on period THron, a period during which the upper-arm switch SWH is held in the on state, and measure, as an upper-arm off period THroff, a period during which the upper-arm switch SWH is held in the off state. For example, referring to FIGS. 14A to 14M and 15A to 15M, the processing unit 90 can be configured to measure the period from the time t8 to the time t12 as the upper-arm on period THron, and measure the period from the time t12 to the time t18 as the upper-arm off period THroff.

Figure 19E:
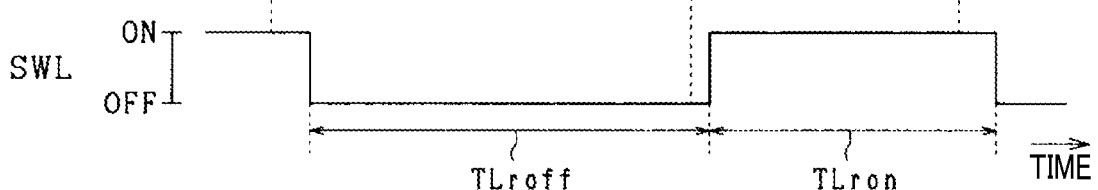

Similarly, the processing unit 90 is configured to, as illustrated in FIG. 19E, measure, as a lower-arm on period TLron, a period during which the lower-arm switch SWL is held in the on state, and measure, as a lower-arm off period TLroff, a period during which the lower-arm switch SWL is held in the off state.

For example, when the polarity of the current I is positive, the processing unit 90 can be configured to measure the period from the time t16 to the time t4 as the lower-arm on period TLron, and measure the period from the time t4 to the time t16 as the lower-arm off period TLroff (see FIGS. 14A to 14M and 15A to 15M).

The drive IC 50 configured above illustrated in FIG. 18 is capable of performing the following first to third routines.

The First Routine

The upper-arm deadtime generator 62H is configured to perform a first task included in the first routine. The first task is configured to correct each logical inversion timing of the upper-arm gate signal GmH from the logical high level to the logical low level to thereby match the measured upper-arm on period THron to the upper-arm on command period TH*on.

The lower-arm deadtime generator 62L is configured to perform a second task included in the first routine. The second task is configured to correct each logical inversion timing of the lower-arm gate signal GmL from the logical high level to the logical low level to thereby match the measured lower-arm on period TLron to the lower-arm on command period TL*on.

Each of the deadtime generators 62H and 62L corresponds to an on corrector when the drive IC 50 performs the first routine.

The first routine performed by the deadtime generators 62H and 62L makes it possible to correct the gate signals GmH and GmL to thereby make 1. An actual operating state of the upper-arm switch SWH closer to a corresponding commanded operating state specified by the on command or off command 2. An actual operating state of the lower-arm switch SWL closer to a corresponding commanded operating state specified by the on command or off command The Second Routine The upper-arm deadtime generator 62H is configured to perform a first task included in the second routine. The first task is configured to correct each logical inversion timing of the upper-arm gate signal GmH from the logical high level to the logical low level to thereby match the measured upper-arm off period THroff to the upper-arm off command period TH*off.

The lower-arm deadtime generator 62L is configured to perform a second task included in the second routine. The second task is configured to correct each logical inversion timing of the lower-arm gate signal GmL from the logical high level to the logical low level to thereby match the measured lower-arm off period TLroff to the lower-arm off command period TL*off.

Each of the deadtime generators 62H and 62L corresponds to an off corrector when the drive IC 50 performs the second routine.

The second routine performed by the deadtime generators 62H and 62L makes it possible to correct the gate signals GmH and GmL to thereby make 1. The actual operating state of the upper-arm switch SWH closer to the corresponding commanded operating state specified by the on command or off command
2. The actual operating state of the lower-arm switch SWL closer to the corresponding commanded operating state specified by the on command or off command The Third Routine The processing unit 90, which serves as a deadtime corrector, is configured to perform the third routine to thereby calculate the first command deadtime DT1* and the second command deadtime DT2* in accordance with the measured periods THron, THroff, TLron, and TLroff and the command periods TH*on, TH*off, TL*on, and TL*off.

Specifically, the processing unit 90 is configured to calculate the first command deadtime DT1* using an appropriate one of the following equations (eq1), (eq2), and (eq3):

$$DT1^* = (THron - TH^*on) \qquad (eq1)$$

$$DT1^* = (TH^*off - THroff) \qquad (eq2)$$

$$DT1^* = (THron - TH^*on)/2 + (TH^*off - THroff)/2 \qquad (eq3)$$

Similarly, the processing unit 90 is configured to calculate the second command deadtime DT2* using an appropriate one of the following equations (eq4), (eq5), and (eq6):

$$DT2^* = (TLron - TL^*on) \qquad (eq4)$$

$$DT2^* = (TL^*off - TLroff) \qquad (eq5)$$

$$DT1^* = (TLron - TL^*on)/2 + (TL^*off - TLroff)/2 \qquad (eq6)$$

The upper-arm deadtime generator 62H is configured to delay, by the calculated first command deadtime DT1*, a next logical inversion of the upper-arm drive signal GH from the logical low level to the logical high level, thus generating the upper-arm gate signal GmH.

Similarly, the lower-arm deadtime generator 62L is configured to delay, by the calculated second command deadtime DT2*, a next logical inversion of the lower-arm drive signal GL from the logical low level to the logical high level, thus generating the lower-arm gate signal GmL.

The third routine makes it possible to reduce the actual deadtimes for the upper- and lower-arm switches SWH and SWL.

Modifications

The above embodiments can be variably modified as follows:

In place of the output voltage at the positive input terminal, the output voltage at the negative input terminal of the fully differential amplifier 83 can be inputted to each of the comparators 87H and 88H.

Each of the upper-arm detectors 82H and 82L is not limited to include the fully differential amplifier 83, and can be configured to include a differential amplifier. The following describes an example of the circuit configuration of the upper-arm detector 82H including such a differential amplifier in place of the fully differential amplifier 83.

Referring to FIG. 21, the upper-arm detector 82H is, as illustrated in FIG. 21, comprised of a differential amplifier 103, an input capacitor 104, a hold capacitor 105, and a reset switch 106.

Each of the capacitors 104 and 105 has opposing first and second ends. The differential amplifier 103 has a non-inverting input terminal, an inverting input terminal, and an output terminal.

The input capacitor 104 is arranged to connect between the drain of the upper-arm switch SWH and the inverting input terminal of the differential amplifier 103; the inverting input terminal serves as a first input terminal. The first end of the hold capacitor 105 is connected to the inverting input terminal of the differential amplifier 103. The output terminal of the differential amplifier 103 is connected to the second end of the hold capacitor 105. The source of the upper-arm switch SWH is connected to the non-inverting input terminal of the differential amplifier 103; the non-inverting input terminal serves as a second input terminal.

The reset switch 106 is connected in parallel to the hold capacitor 105.

Turning on the reset switch 106 results in the upper-arm detector 82H being reset. Turning off the reset switch 106 results in the resetting of the upper-arm detector 82H being cancelled.

The fully differential amplifier illustrated in FIG. 3, which is configured as a non-inverting amplifier, can be configured as an inverting amplifier. In this modification, the subsequent circuit configuration of each drive IC 50, which follows the inverting amplifier, is modified in conformity with the changed inverting amplifier.

Each embodiment uses an inverter as an example of a power converter, but the present disclosure cannot be limited to such an inverter. For example, the present disclosure can use, as an example of a power converter, a full bridge circuit equipped with a first series-connected switch member comprised of a first pair of upper- and lower-arm switches connected in series to each other, and a second series-connected switch member comprised of a second pair of upper- and lower-arm switches connected in series to each other The drive circuits and methods described in the present disclosure can be implemented by a dedicated computer including a memory and a processor programmed to perform one or more functions embodied by one or more computer programs.

The drive circuits and methods described in the present disclosure can also be implemented by a dedicated computer including a processor comprised of one or more dedicated hardware logic circuits.

The drive circuits and methods described in the present disclosure can further be implemented by a processor system comprised of a memory, a processor programmed to perform one or more functions embodied by one or more computer programs, and one or more hardware logic circuits.

The one or more programs can be stored in a non-transitory storage medium as instructions to be carried out by a computer or a processor.

The present disclosure, which has been described in accordance with the embodiments, is not limited to the disclosed embodiments and configurations included in the embodiments. The present disclosure can include various modifications and various changes within the scope of the present disclosure. The present disclosure is not limited to combinations of the components and/or elements disclosed in the disclosed embodiments, and therefore can be implemented by various combinations within the scope of the present disclosure.

What is claimed is:

1. A drive circuit for a power converter that includes an upper-arm switch and a lower-arm switch, each of which has first and second terminals, diodes being connected in antiparallel to the respective upper- and lower-arm switches, the drive circuit comprising:
- a signal generator configured to generate a gate signal that alternately turns on the upper- and lower-arm switches while preventing the upper- and lower-arm switches being simultaneously in an on state;
- a voltage divider configured to divide:
  - a first voltage at the first terminal of at least one target switch that is at least one of the upper- and lower-arm switches; and
  - a second voltage at the second terminal of the at least one target switch to thereby obtain a first divided terminal voltage and a second divided terminal voltage; and
- a differential circuit unit having a first input terminal and a second input terminal, the first divided terminal voltage being inputted to the first input terminal of the differential circuit unit, the second divided terminal voltage being inputted to the second input terminal of the differential circuit unit, the differential circuit unit being configured to generate an output voltage based on a difference between the first and second divided terminal voltages,
- the differential circuit unit being configured such that:
  - resetting of the output voltage of the differential circuit unit is carried out; and
  - the resetting of the output voltage of the differential circuit unit is cancelled, a value of the difference between the first and second divided terminal voltages at a timing of cancelling the resetting being defined as a reference voltage,
- the differential circuit unit being configured to generate, as the output voltage, a product of a voltage change from the reference voltage and a predetermined amplification factor after cancelling of the resetting of the differential circuit unit,
- the signal generator being configured to generate the gate signal for each of the upper- and lower-arm switches in accordance with a value of the output voltage of the differential circuit unit while the upper- and lower-arm switches are in an off state.

2. The drive circuit according to claim 1, wherein:
the at least one target switch has a high-side terminal as the first terminal, and a low-side terminal as the second terminal;
the voltage divider comprises:
  a first input capacitor arranged to connect the high-side terminal of the at least one target switch and the first input terminal of the differential circuit unit;
  a second input capacitor arranged to connect the low-side terminal of the at least one target switch and the second input terminal of the differential circuit unit;
  a first hold capacitor having a first end and a second end, the first end of the first hold capacitor being connected to the first input terminal of the differential circuit unit; and
  a second hold capacitor having a first end and a second end, the first end of the second hold capacitor being connected to the second input terminal of the differential circuit unit; and
the differential circuit unit comprises:
  a fully differential amplifier having a first output terminal and a second output terminal, the first output terminal being connected to the second end of the first hold capacitor, the second output terminal being connected to the second end of the second hold capacitor;
  a first reset switch connected in parallel to the first hold capacitor; and
  a second reset switch connected in parallel to the second hold capacitor,
each of the first and second reset switches being switched from an off state to an on state, so that the resetting of the voltage outputted from the differential circuit unit is carried out,
each of the first and second reset switches being switched from the on state to the off state, so that the resetting of the output voltage of the differential circuit unit is cancelled.

3. The drive circuit according to claim 1, wherein:
the at least one target switch has a high-side terminal as the first terminal, and a low-side terminal as the second terminal;
the voltage divider comprises:
  an input capacitor arranged to connect the high-side terminal of the at least one target switch and the first input terminal of the differential circuit unit; and
a hold capacitor having a first end and a second end, the first end of the hold capacitor being connected to the first input terminal of the differential circuit unit; and
the differential circuit unit comprises:
  a differential amplifier having an output terminal connected to the second end of the hold capacitor; and
  a reset switch connected in parallel to the hold capacitor,
the reset switch being switched from an off state to an on state, so that the resetting of the output voltage of the differential circuit unit is carried out,
the reset switch being switched from the on state to the off state, so that the resetting of the output voltage of the differential circuit unit is cancelled.

4. The drive circuit according to claim 1, wherein:
the resetting of the output voltage of the differential circuit unit is carried out while only one of the upper-arm switch and the lower-arm switch is in the on state; and
the resetting of the output voltage of the differential circuit unit is cancelled until the only one of the upper-arm switch and the lower-arm switch is switched from the on state to the off state.

5. The drive circuit according to claim 1, wherein:
the signal generator is configured to:
  compare the output voltage of the differential circuit unit with a predetermined threshold while both the upper- and lower-arm switches are in the off state to thereby determine whether one of the upper- and lower-arm switches is switched from the off state to the on state;
  generate a high/low level signal based on determination of whether one of the upper- and lower-arm switches is switched from the on state to the off state; and
  generate the gate signal for each of the upper- and lower-arm switches based on the high/low level signal.

6. The drive circuit according to claim 5, wherein:
execution of the resetting of the output voltage of the differential circuit unit and cancellation of the resetting are cyclically repeated; and
the signal generator is configured to:
  determine whether a time that has elapsed since the resetting of the output voltage of the differential circuit unit executed at a current cycle until cancellation of the resetting executed at the current cycle is smaller than a predetermined threshold time; and change a value of the predetermined threshold to another value without execution of the resetting of the output voltage of the differential circuit unit at a next cycle upon determination that the time that has elapsed since the resetting of the output voltage of the differential circuit unit executed at the current cycle until cancellation of the resetting executed at the current cycle is smaller than the predetermined threshold time.

7. The drive circuit according to claim 5, wherein:

a voltage drop across the diode of the at least one target switch is changeable within a predetermined range from a lower limit to an upper limit inclusive; and an absolute value of the predetermined threshold is set to a value smaller than the lower limit of the range.

8. The drive circuit according to claim 5, wherein:

the gate signal for each of the upper- and lower-arm switches has one of:

an on command for turning on the corresponding one of the upper- and lower-arm switches; and an off command for turning off the corresponding one of the upper- and lower-arm switches;

one of the upper-arm switch and the lower-arm switch, which is currently in the on state, is defined as a currently on-state switch, and the other of the upper-arm switch and the lower-arm switch, which is scheduled to be turned on next, is defined as an opposing turn-on switch; and the signal generator is configured to change the gate signal for the opposing turn-on switch from the off command to the on command upon determination that the high/low level signal represents that the currently on-state switch is switched from the on state to the off state.

9. The drive circuit according to claim 5, wherein:

the gate signal for each of the upper- and lower-arm switches has one of:

an on command for turning on the corresponding one of the upper- and lower-arm switches; and an off command for turning off the corresponding one of the upper- and lower-arm switches; and the signal generator is configured to generate the gate signal alternately changing between the on command and the off command for alternately turning on the upper- and lower-arm switches while setting a deadtime that prevents the upper- and lower-arm switches being simultaneously in the on state, the drive circuit further comprising:

a measuring unit configured to measure, based on the high/low level signal, a turn-on time and a turn-off time of at least one of the upper-arm switch and the lower-arm switch, the turn-on time of the at least one of the upper-arm switch and the lower-arm switch representing a time that has elapsed since the on command of the gate signal was generated until the at least one of the upper-arm switch and the lower-arm switch is actually turned on, the turn-off time of the at least one of the upper-arm switch and the lower-arm switch representing a time that has elapsed since the off command of the gate signal was generated until the at least one of the upper-arm switch and the lower-arm switch is actually turned off; and a corrector configured to correct, based on the turn-on time and the turn-off time measured by the measuring unit, the gate signal to thereby bring an actual operating state of each of the upper- and lower-arm switches to approach a corresponding operating state defined by the gate signal.

10. The drive circuit according to claim 9, wherein:

the corrector is configured to correct the gate signal to thereby correct the deadtime.

11. The drive circuit according to claim 5, wherein:

the gate signal for each of the upper- and lower-arm switches has one of:

an on command for turning on the corresponding one of the upper- and lower-arm switches; and an off command for turning off the corresponding one of the upper- and lower-arm switches; and the signal generator is configured to generate the gate signal alternately changing between the on command and the off command for alternately turning on the upper- and lower-arm switches while setting a deadtime that prevents the upper- and lower-arm switches being simultaneously in the on state, the drive circuit further comprising:

an on-period measuring unit configured to measure, based on the high/low level signal, an on period of at least one of the upper-arm switch and the lower-arm switch, the on period of the at least one of the upper-arm switch and the lower-arm switch representing a period during which the at least one of the upper-arm switch and the lower-arm switch is held in the on state; and an on-period corrector configured to correct, based on the on period measured by the on-period measuring unit, the gate signal to thereby bring an actual on period of each of the upper- and lower-arm switches to approach an on-command period during which the gate signal is in the on command.

12. The drive circuit according to claim 5, wherein:

the gate signal for each of the upper- and lower-arm switches has one of:

an on command for turning on the corresponding one of the upper- and lower-arm switches; and an off command for turning off the corresponding one of the upper- and lower-arm switches; and the signal generator is configured to generate the gate signal alternately changing between the on command and the off command for alternately turning on the upper- and lower-arm switches while setting a deadtime that prevents the upper- and lower-arm switches being simultaneously in the on state, the drive circuit further comprising:

an off-period measuring unit configured to measure, based on the high/low level signal, an off period of at least one of the upper-arm switch and the lower-arm switch, the off period of the at least one of the upper-arm switch and the lower-arm switch representing a period during which the at least one of the upper-arm switch and the lower-arm switch is held in the off state; and an off-period corrector configured to correct, based on the off period measured by the off-period measuring unit, the gate signal to thereby bring an actual off period of each of the upper- and lower-arm switches to approach an off-command period during which the gate signal is in the off command.

13. The drive circuit according to claim 5, wherein:

the gate signal for each of the upper- and lower-arm switches has one of:

an on command for turning on the corresponding one of the upper- and lower-arm switches; and an off command for turning off the corresponding one of the upper- and lower-arm switches; and the signal generator is configured to generate the gate signal alternately changing between the on command and the off command for alternately turning on the upper- and lower-arm switches while setting a deadtime that prevents the upper- and lower-arm switches being simultaneously in the on state, the drive circuit further comprising:

an on-period measuring unit configured to measure, based on the high/low level signal, an on period of at least one of the upper-arm switch and the lower-arm switch, the on period of the at least one of the upper-arm switch and the lower-arm switch representing a period during which the at least one of the upper-arm switch and the lower-arm switch is held in the on state;

an off-period measuring unit configured to measure, based on the high/low level signal, an off period of the at least one of the upper-arm switch and the lower-arm switch, the off period of the at least one of the upper-arm switch and the lower-arm switch representing a period during which the at least one of the upper-arm switch and the lower-arm switch is held in the off state; and a deadtime corrector configured to correct the deadtime in accordance with the on period measured by the on-period measuring unit and the off period measured by the off period measuring unit.

* * * * *